(12) United States Patent
Rachmady et al.

(10) Patent No.: US 9,252,275 B2
(45) Date of Patent: Feb. 2, 2016

(54) NON-PLANAR GATE ALL-AROUND DEVICE AND METHOD OF FABRICATION THEREOF

(71) Applicant: Intel Corporation, Santa Clara, CA (US)

(72) Inventors: Willy Rachmady, Beaverton, OR (US); Ravi Pillarisetty, Portland, OR (US); Van H. Lee, Portland, OR (US); Jack T. Kavalieros, Portland, OR (US); Robert S. Chau, Beaverton, OR (US); Jessica S. Kachian, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/582,131

(22) Filed: Dec. 23, 2014

(65) Prior Publication Data

US 2015/0144880 A1    May 28, 2015

Related U.S. Application Data

(63) Continuation of application No. 13/997,118, filed as application No. PCT/US2011/067234 on Dec. 23, 2011, now Pat. No. 8,987,794.

(51) Int. Cl.
*H01L 29/04* (2006.01)
*H01L 29/78* (2006.01)
(Continued)

(52) U.S. Cl.
CPC .......... *H01L 29/7851* (2013.01); *H01L 29/045* (2013.01); *H01L 29/0669* (2013.01); *H01L 29/0673* (2013.01); *H01L 29/1033* (2013.01); *H01L 29/165* (2013.01);
(Continued)

(58) Field of Classification Search
CPC ................. H01L 29/66795; H01L 29/785
See application file for complete search history.

(56) References Cited

U.S. PATENT DOCUMENTS

| 8,309,950 B2 | 11/2012 | Iwayama et al. |
| 2008/0093628 A1 | 4/2008 | Lee et al. |
| 2011/0233522 A1 | 9/2011 | Cohen et al. |

FOREIGN PATENT DOCUMENTS

JP    2011-66151    3/2011

OTHER PUBLICATIONS

Notice of Preliminary Rejection for Korean Patent Application No. 10-2014-7017953 mailed Aug. 16, 2015 and English Translation thereof.

*Primary Examiner* — Roy Potter
*Assistant Examiner* — Paul Patton
(74) *Attorney, Agent, or Firm* — Blakely, Sokoloff, Taylor & Zafman LLP

(57) ABSTRACT

A non-planar gate all-around device and method of fabrication thereby are described. In one embodiment, the device includes a substrate having a top surface with a first lattice constant. Embedded epi source and drain regions are formed on the top surface of the substrate. The embedded epi source and drain regions have a second lattice constant that is different from the first lattice constant. Channel nanowires having a third lattice are formed between and are coupled to the embedded epi source and drain regions. In an embodiment, the second lattice constant and the third lattice constant are different from the first lattice constant. The channel nanowires include a bottom-most channel nanowire and a bottom gate isolation is formed on the top surface of the substrate under the bottom-most channel nanowire. A gate dielectric layer is formed on and all-around each channel nanowire. A gate electrode is formed on the gate dielectric layer and surrounding each channel nanowire.

19 Claims, 12 Drawing Sheets

(51) Int. Cl.
*H01L 29/423* (2006.01)
*H01L 29/786* (2006.01)
*H01L 29/06* (2006.01)
*H01L 29/165* (2006.01)
*H01L 29/66* (2006.01)
*H01L 29/10* (2006.01)

(52) U.S. Cl.
CPC ... *H01L 29/42392* (2013.01); *H01L 29/66795* (2013.01); *H01L 29/785* (2013.01); *H01L 29/7848* (2013.01); *H01L 29/78696* (2013.01); *H01L 2029/7858* (2013.01)

NON-PLANAR GATE ALL-AROUND DEVICE AND METHOD OF FABRICATION THEREOF

CROSS-REFERENCE TO RELATED APPLICATIONS

This application is a continuation of U.S. patent application Ser. No. 13/997,118, filed on Jun. 21, 2013, which is a U.S. national phase application of International Application No. PCT/US2011/067234, filed on Dec. 23, 2011, the entire contents of which are hereby incorporated by reference herein.

BACKGROUND

1) Field

Embodiments of this invention relate to the field of semiconductor devices and more particularly to a non-planar gate all-around device and method of fabrication.

2) Description of Related Art

As integrated device manufacturers continue to shrink the feature sizes of transistor devices to achieve greater circuit density and higher performance, there is a need to enhance transistor drive currents while reducing short-channel effects such as parasitic capacitance and off-state leakage for next-generation devices. One way of increasing transistor drive currents is to use higher carrier mobility semiconductor materials to form the channel Higher carrier mobility in the channel supports higher transistor drive currents. Carrier mobility is a measure of the velocity at which carriers flow in a semiconductor material under an external unit electric field. Process induced stress (sometimes referred to as stress) on the semiconductor body is another way of increasing drive currents. Inducing stress on the semiconductor body enhances carrier mobility, thereby increasing the drive currents in transistor devices.

Non-planar transistors, such as the tri-gate transistor, are a recent development in semiconductor processing for controlling short channel effects. With tri-gate transistors, the gate is adjacent to three sides of the channel region. Because the gate structure surrounds the fin on three surfaces, the transistor essentially has three gates controlling the current through the fin or channel region. These three gates allow for fuller depletion in the fin and result in less short-channel effects due to steeper sub-threshold current swing (SS) and smaller drain induced barrier lowering (DIBL). Unfortunately, the fourth side, the bottom part of the channel is far away from the gate electrode and thus is not under close gate control. As transistor dimensions are continually scaled down to sub 20-25 nm technology nodes, parasitic leakage paths between the source and drains become problematic for tri-gate transistors.

BRIEF DESCRIPTION OF THE DRAWINGS

Embodiments of the present disclosure are illustrated by way of example, and not by way of limitation, in the figures of the accompanying drawings, in which.

DETAILED DESCRIPTION

Figure 1A:
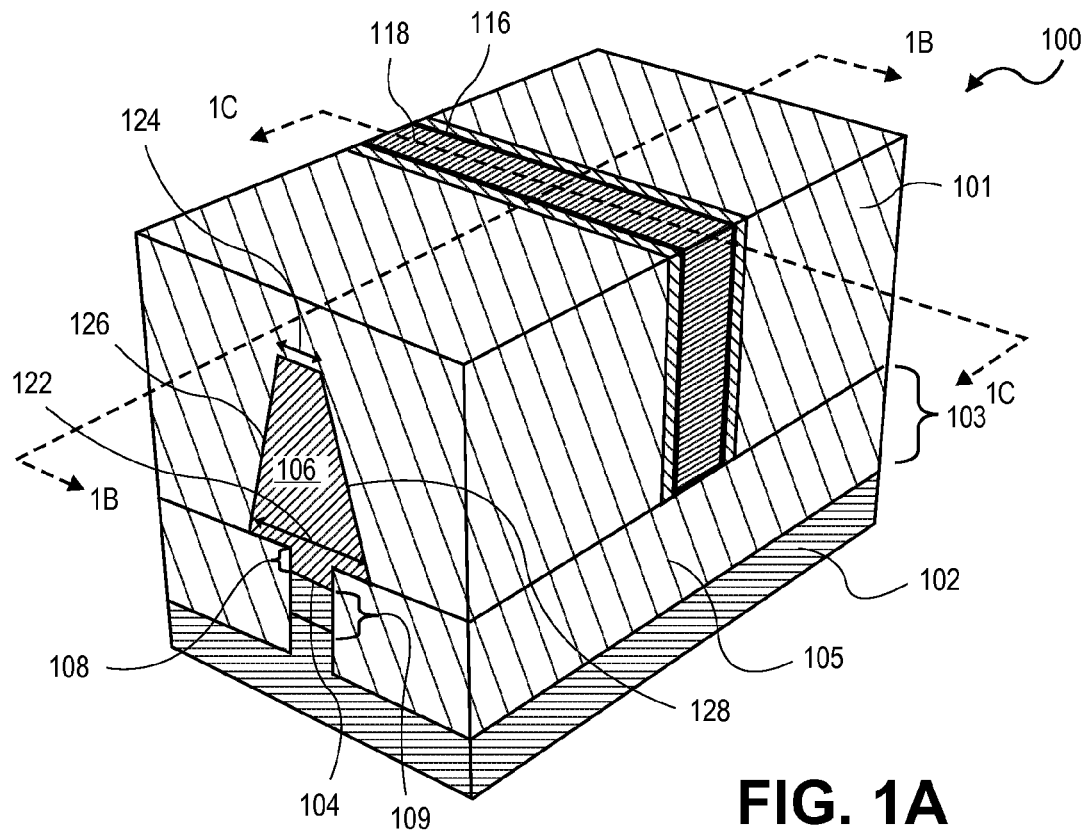
FIG. 1A to 1D illustrate to a non-planar gate all-around device having embedded epi source and drain regions in accordance with an embodiment of the present invention.

The present invention is a novel gate all-around transistor and a method of fabrication. In the following description, numerous details are set forth in order to provide a thorough understanding of the present invention. It will be apparent, however, to one skilled in the art, that the present invention may be practiced without these specific details. In other instances, well-known semiconductor processes and manufacturing techniques have not been described in detail to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Embodiments of the present invention include a non-planar gate all-around transistor device having channel nanowires that are wrapped all around by a gate dielectric layer and a gate electrode. Having a gate electrode that completely surrounds the channel nanowires increases gate control and results in improved short channel effects due to parasitic leakage paths being completely cut-off. The channel nanowires are disposed between source and drain regions. In one or more embodiments of the present invention, the channel nanowires are composed of undoped germanium and are uniaxially lattice stressed. The undoped germanium provides higher carrier mobility than conventional silicon and the uniaxially lattice stress further enhances the carrier mobility in the channel nanowires, thereby achieving very high transistor device drive currents. In an embodiment of the present invention, the source and drain regions are formed by etching away portions of a fin adjacent to the channel nanowires, and then epitaxially growing a semiconductor material from the substrate to form "embedded epi" source and drain regions. Embedded epi source and drain regions provide either an additional force or anchors to the channel nanowires that help to maintain or enhance, or both maintain and enhance, the uniaxial lattice stress in the channel nanowires. Additionally, in an embodiment of the present invention, the gate all around transistor includes a bottom gate isolation layer formed between the substrate and the bottom channel nanowire so that the gate electrode may be formed all around the bottom channel nanowire without capacitive coupling to the substrate. One or more embodiments of the present invention may include a non-planar gate all-around transistor device with one of embedded epi source and drain regions or a bottom gate isolation layer formed between a substrate and a bottom channel nanowire, or both.

Figure 1B:
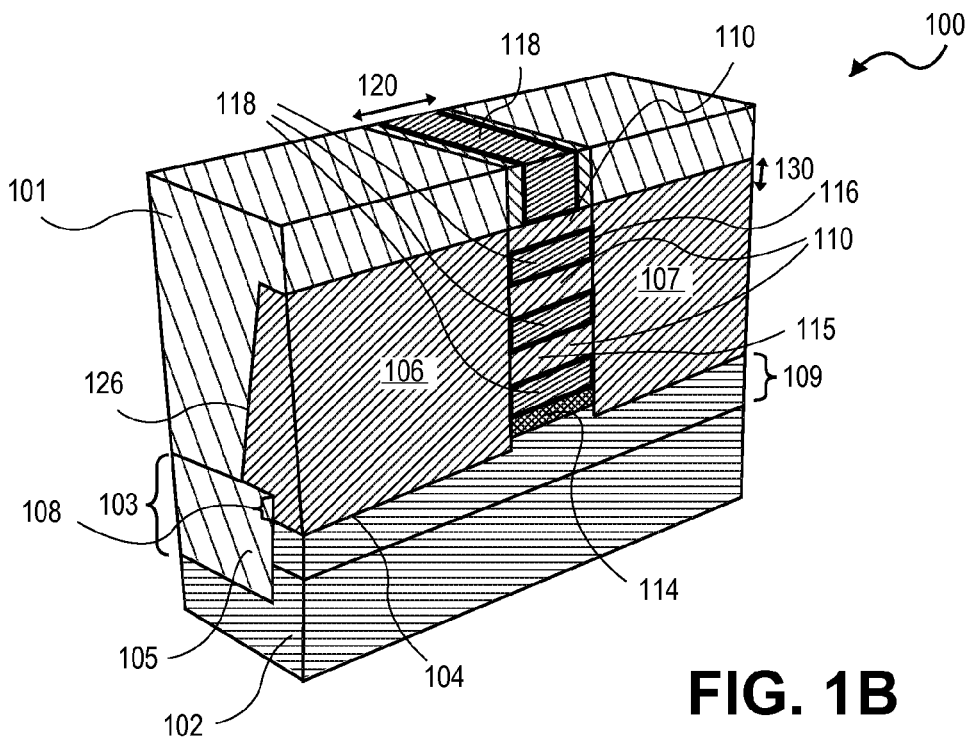
Figure 1C:
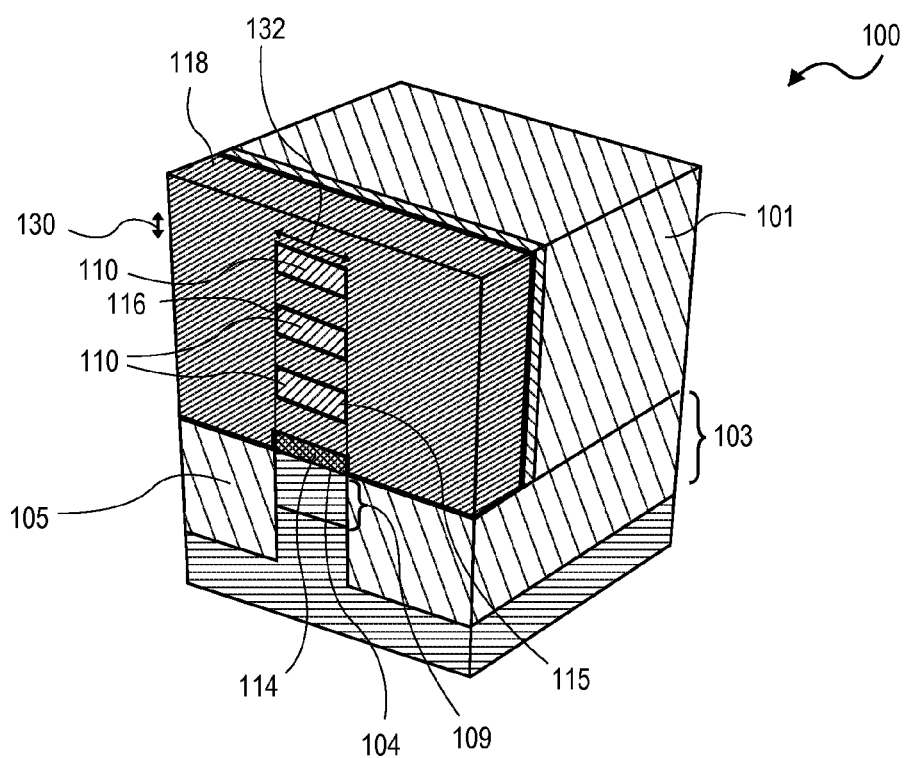
Figure 1D:
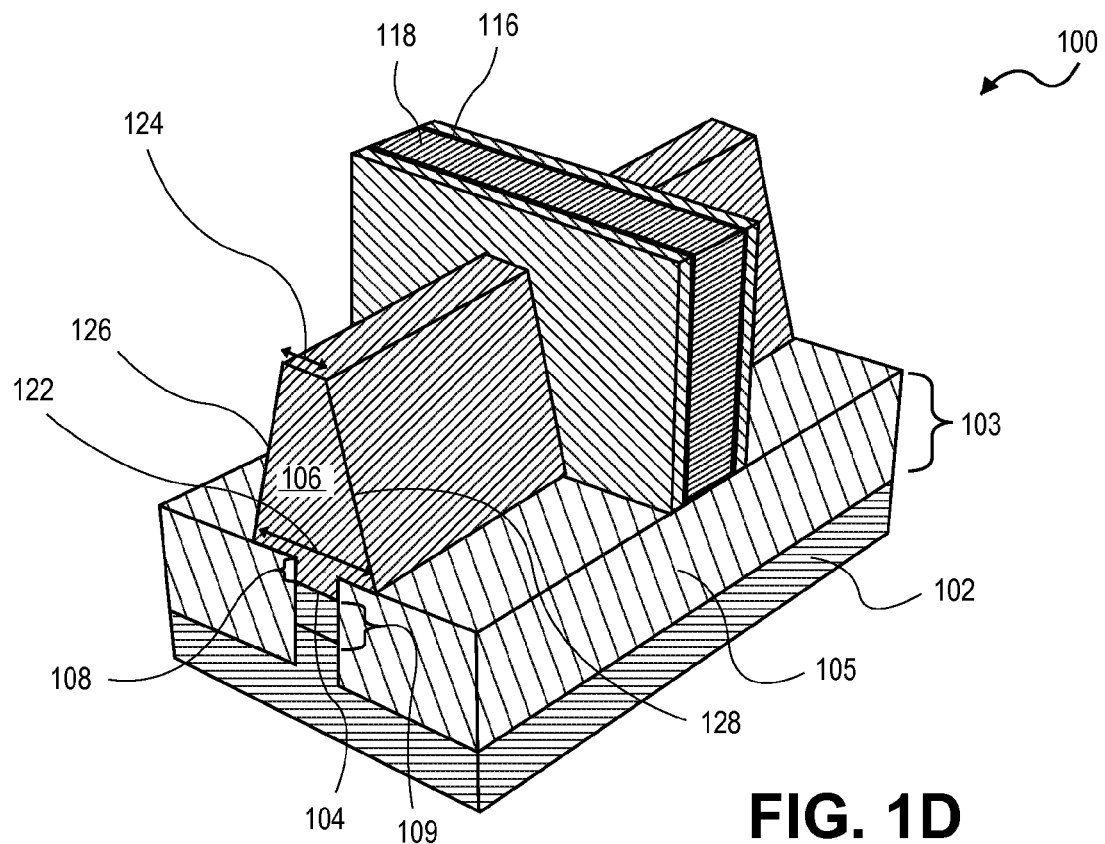

FIGS. 1A to 1D illustrate a non-planar gate all-around device 100, in accordance with an embodiment of the present invention. FIG. 1A is a three-dimensional overhead/side view of device 100 within dielectric layer 101, FIG. 1B is a cross-sectional view taken through the embedded epi source 106 and drain 107, and FIG. 1C is a cross-sectional view taken through the gate electrode 118. FIG. 1D is a three-dimensional overhead/side view of device 100 without dielectric layer 101. Device 100 includes a substrate 102 having a top surface 104. Embedded epi source 106 and drain 107 regions are disposed on top surface 104 of substrate 102 and channel nanowires 110 are coupled between embedded epi source 106 and drain 107 regions. Embedded epi source 106 and drain 107 regions can be collectively referred to as a embedded epi source/drain pair. A gate dielectric layer 116 is formed on and all-around each channel nanowire 110, except at the ends of channel nanowires 110 where channel nanowires 110 are coupled to embedded epi source 106 and drain 107 regions. A gate electrode 118 is formed on gate dielectric layer 116 and completely surrounds each channel nanowire 110.

In an embodiment, top surface 104 of substrate 102, embedded epi source 106 and drain 107 regions, and channel nanowires 110 each comprise a material having a lattice constant. The lattice constant of top surface 104 is different from the lattice constants of embedded epi source 106 and drain 107 regions and channel nanowires 110. In a particular embodiment, the lattice constants of embedded epi source 106 and drain 107 regions and channel nanowires 110 are larger than the lattice constant of top surface 104. In one such embodiment, top surface 104 of substrate 102 is silicon germanium, channel nanowires 110 are undoped germanium, and embedded epi source 106 and drain 107 regions are germanium. The lattice mismatch (e.g., the lattice constant mismatch) between embedded epi source 106 and drain 107 regions, channel nanowires 110, and top surface 104 results in lattice stress in channel nanowires 110 and in embedded epi source 106 and drain 107 regions. In one embodiment, channel nanowires 110 and embedded epi source 106 and drain 107 regions are uniaxially lattice stressed in a direction parallel to the length 120 of channel nanowires 110 and are lattice relaxed in a direction perpendicular to the length 120 of channel nanowires 110. The lattice constant mismatch between top surface 104 and embedded epi source 106 and drain 107 regions also results in embedded epi source 106 and drain 107 regions providing a force on channel nanowires 110, in an embodiment. The force may help to maintain the uniaxial lattice stress in channel nanowires 110.

In an embodiment, channel nanowires 110 may comprise a single crystalline material having a carrier mobility that is greater than single crystalline bulk silicon. The higher carrier mobility allows device 100 to achieve higher drive currents and greater performance. In a particular embodiment, channel nanowires 110 are undoped germanium (Ge). The absence of dopants minimizes scattering of charge carriers and helps to maximize carrier mobility in channel nanowires 110.

In an embodiment of the present invention, as illustrated in FIGS. 1A and 1B, embedded epi source 106 and drain 107 regions may be disposed in a source/drain trench 108 where the top surface 104 of substrate 102 is recessed beneath the top surface of shallow trench isolation layer 105. Forming the embedded epi source 106 and drain 107 regions in source/drain trench 108 helps to confine the growth of the embedded epi source 106 and drain 107 regions. However, embedded source 106 and drain 107 regions need not necessarily be formed in a trench and may be on the top surface 104 of substrate 102 which is planar with or above isolation region 103. Embedded epi source 106 and drain 107 regions may be <111>-faceted where the width 122 at the bottom is larger than the width 124 at the top of embedded epi source 106 and drain 107 regions. In such an embodiment, the plane corresponding to sidewalls 126 and 128 is the <111> lattice orientation of embedded epi source 106 and drain 107 regions.

In an embodiment, device 100 includes a bottom gate isolation 114 that is disposed on top surface 104 of substrate 102 and under the bottom-most channel nanowire 115. Bottom gate isolation 114 serves as a capacitive isolation barrier to prevent parasitic coupling of top surface 104 of substrate 102 by gate electrode 118. The effectiveness of bottom gate isolation 114 as a capacitive isolation barrier depends on the material from which it is formed and its thickness. In an embodiment, bottom gate isolation 114 is formed from any dielectric material (e.g., silicon oxide, silicon nitride, silicon oxynitride, low-k dielectric materials, etc.) that prevents parasitic coupling of top surface 104 of substrate 102 by gate electrode 118. In a specific embodiment, bottom gate isolation 114 is composed of a silicon oxide layer. In an embodiment, the thickness of bottom gate isolation is sufficiently thick to isolate top surface 104 of substrate 102 from capacitive coupling by gate electrode 118. In a particular embodiment, bottom gate isolation 114 is between about 100-300 Å. Bottom gate isolation 114 enables the bottom most channel nanowire 115 to be fully wrapped around by gate electrode 118. If bottom gate isolation 114 is not present then bottom channel nanowire 115 would need to be controlled by a trigate or similar structure in order to prevent capacitive coupling between the gate electrode 118 and the top surface 104 of substrate 102 in order to prevent an undesired conductive channel from forming in the substrate when the device is turned "on".

In an embodiment of the present invention, substrate 102, may comprise one or more epitaxial single crystalline semiconductor layers (e.g., silicon, germanium, silicon germanium, gallium arsenide, indium phosphide, indium gallium arsenide, aluminum gallium arsenide, etc.) grown atop a distinct crystalline substrate (silicon, germanium, gallium arsenide, sapphire, etc.). In one such embodiment, the epitaxially grown semiconductor layers are one or more buffer layers 109 having lattice constants different from the distinct crystalline substrate. The buffer layers 109 may serve to grade the lattice constant from the distinct crystalline substrate to the top surface 104. For example, substrate 102 may comprise epitaxially grown silicon germanium (SiGe) buffer layers 109 on a distinct crystalline silicon substrate. The germanium concentration of the SiGe buffer layers 109 may increase from 30% germanium at the bottom-most buffer layer to 70% germanium at the top-most buffer layer, thereby gradually increasing the lattice constant.

Shallow trench isolation (STI) regions 103 may be disposed on substrate 102, in an embodiment. STI regions 103 serve to reduce current leakage between devices 100 formed adjacent to one another. A STI layer 105 may be disposed in the STI regions 103. STI layer 105 may comprise any well-known dielectric material, such as, but not limited to silicon oxide, silicon nitride, silicon oxynitride, a low-k dielectric, and any combination thereof.

As shown in FIG. 1B, channel nanowires 110 are formed above top surface 104 of substrate 102 and between embedded epi source 106 and drain 107 regions. Channel nanowires 110 may be formed of any well-known material such as, but not limited to Si, Ge, SiGe, GaAs, InSb, GaP, GaSb, InAlAs, InGaAs, GaSbP, GaAsSb, InP, and carbon nanotubes. Channel nanowires 110 can be formed of any well-known material which can be reversely altered from an insulating state to a conductive state by applying external electrical fields. Ideally, for higher device performance, channel nanowires 110 are formed from an undoped lattice-stressed single crystalline semiconductor material having a carrier mobility greater than single crystalline silicon, in an embodiment. As previously explained, the absence of dopants in channel nanowires 110 minimizes scattering of charge carriers and helps to maximize carrier mobility and thus increase drive current. Lattice stress in channel nanowires 110 also enhances carrier mobility and improves device performance. Typically, channel nanowires are compressive stressed for enhanced hole mobility in p-type transistor devices and are tensile stressed for enhanced electron mobility in n-type transistor devices. In an embodiment, channel nanowires 110 are uniaxially lattice stressed in a direction parallel to length 120 of channel nanowires 110, but lattice relaxed in a direction perpendicular to the length 120 of channel nanowires 110. In another embodiment, channel nanowires 110 may be a doped single crystalline semiconductor material. For example, channel nanowires 110 may be formed of doped single crystalline silicon. When channel nanowires 110 are doped, they are typically doped to a p-type conductivity when forming a NMOS transistor device and doped to a n-type conductivity when forming a PMOS transistor device.

As shown in FIG. 1B, channel nanowires 110 may run parallel to top surface 104 and form a vertical array of channel nanowires 110. In an embodiment, the number of channel nanowires between embedded epi source 106 and drain 107 regions is between 3 to 6. A greater number of channel nanowires 110 allows for greater drive current through device 100. Channel nanowires 110 have a thickness 130, a width 132, and a length 120. In an embodiment of the present invention, thickness 130 is between about 5-30 nm, width 132 is between about 5-50 nm, and length 120 is between 10-100 nm. In an embodiment, channel nanowires 110 may be ribbon-shaped nanowires where the width 132 is greater than the thickness 130 of channel nanowires. In further embodiment, the cross-section of channel nanowires 110 may be circular or oval shaped rather than rectangular. The length 120 of channel nanowires essentially defines the gate length (Lg) of transistor device 100. The effective gate "width" (Wg) of a channel nanowire 110 is the perimeter of that channel nanowire 110. For example, for a channel nanowire having a rectangular cross-section, the effective gate "width" of the channel nanowire 110 is the sum of twice the width 132 and twice the thickness 130 of the channel nanowire 110. The effective gate "width" (Wg) of a transistor device 100 is the sum of the perimeters for the channel nanowires 110.

As shown in FIG. 1B, embedded epi source 106 and drain 107 regions are formed on opposite ends of channel nanowires 110 and are coupled to channel nanowires 110. Embedded epi source 106 and drain 107 regions may be formed of any well-known material having a lattice constant. Ideally, embedded epi source 106 and drain 107 regions are formed from an epitaxially grown single crystalline semiconductor such as, but not limited to Si, Ge, GeSn, SiGe, GaAs, InSb, GaP, GaSb, InAlAs, InGaAs, GaSbP, GaAsSb, GaN, GaP, and InP. In an embodiment embedded epi source 106 and drain 107 regions are formed from a single crystalline semiconductor material having a lattice constant different from top surface 104 of substrate 102. As previously described, the lattice constant mismatch between embedded epi source 106 and drain 107 regions and top surface 104 of substrate 102 creates lattice stress in embedded epi source 106 and drain 107 regions, thereby improving electron mobility and transistor performance. In an embodiment, embedded epi source 106 and drain 107 regions are uniaxially lattice stressed in a direction parallel to length 120, but lattice relaxed in a direction perpendicular to length 120. The lattice constant mismatch between the embedded epi source 106 and drain 107 regions and top surface 104 of substrate 102 also causes embedded epi source 106 and drain 107 regions to exert a force on channel nanowires 110 which may help to maintain the lattice stress in channel nanowires 110. In an embodiment the embedded epi source 106 and drain 107 regions are formed from the same single crystalline semiconductor material used to form the channel nanowires 110.

In a particular embodiment, the lattice constant of embedded epi source 106 and drain 107 regions is larger than the lattice constant of top surface 104 of substrate 102. In such an embodiment, embedded epi source 106 and drain 107 regions are compressive stressed and provide a compressive force on channel nanowires 110. In a specific embodiment, embedded epi source 106 and drain 107 regions are epitaxial single crystalline germanium and top surface 104 of substrate 102 is epitaxial single crystalline silicon germanium. The germanium source 106 and drain 107 regions exert a compressive force on channel nanowire 110. In an embodiment, the top surface 104 of the semiconductor substrate 102 may be formed of a semiconductor material (e.g., silicon germanium) having a first lattice constant and the channel nanowires 110 formed of a second semiconductor material (e.g., germanium) having a second lattice constant which is greater than the first lattice constant and the embedded epi source 106 and drain 107 regions may be formed of a third semiconductor material (e.g., gallium arsenide (GaAs)) having a third lattice constant which is greater than lattice constant of the channel nanowires 110 (second lattice constant) to further enhance the compressive stress in channel nanowires 110.

In another embodiment, the lattice constant of embedded epi source 106 and drain 107 regions is smaller than the lattice constant of top surface 104 of substrate 102. In such an embodiment, embedded epi source 106 and drain 107 regions are tensile stressed and provide a tensile force on channel nanowires 110. In an embodiment the top surface 104 of semiconductor substrate 102 may be formed of a single crystalline semiconductor material having a first lattice constant and the channel nanowires 110 formed from a second semiconductor material having a second lattice constant which is less than the first lattice constant and the embedded source 106 and drain 107 regions may be formed of a third semiconductor material having a third lattice constant which is less than the lattice constant of the channel nanowires 110 (second lattice constant) to further enhance the tensile stress in channel nanowires.

Typically, embedded epi source 106 and drain 107 regions are formed to an n-type conductivity type when forming a NMOS transistor device and are formed to a p-type conductivity when forming a PMOS transistor device. In an embodiment of the present invention, embedded epi source 106 and drain 107 regions have a doping concentration between 1E18 atoms/cm3 to 1E21 atoms/cm3. Embedded epi source 106 and drain 107 regions can be formed having a uniform doping concentration or can include sub-regions of different concentrations or dopant profiles. In an embodiment, when device 100 is formed as a symmetrical transistor, embedded epi source 106 and drain 107 regions have the same doping concentration and profile. In another embodiment, device 100 is formed as an asymmetrical transistor and the doping concentration profile of the embedded epi source 106 and drain 107 regions may vary in order to achieve any particular electrical characteristics as well known in the art.

The source 106 and drain 107 regions are said to be "embedded epi" source and drain regions because they are formed, as will be described in greater detail below, by first removing portions of the fin used to create the stressed channel nanowires 110 and then epitaxially growing the source and drain pair. For example, in an embodiment, portions of the fin used to create the stressed channel nanowires 110 are removed and then the source and drain pair is epitaxially grown from the top surface 104 of substrate 102. The lattice of the epitaxially deposited source and drain pair continues from the lattice of the top surface 104 of the substrate. That is, the lattice of the underlying substrate dictates the lattice direction and growth of the overlying embedded epitaxy source 106 and drain 107 regions. The use of embedded epi source 106 and drain 107 regions improves device performance by providing an additional force to the channel nanowires and by providing anchors to the channel nanowires to help maintain the uniaxially stress in the channel nanowires 110 already present from earlier fabrication processes, such as fin patterning. The embedded epi source and drain regions are stressed and, thus, further stress the adjacent nanowire channels. The stress in the channel nanowires may be further enhanced by using a semiconductor material having a different lattice constant than the semiconductor material used to form the channel nanowires.

Figure 1E:
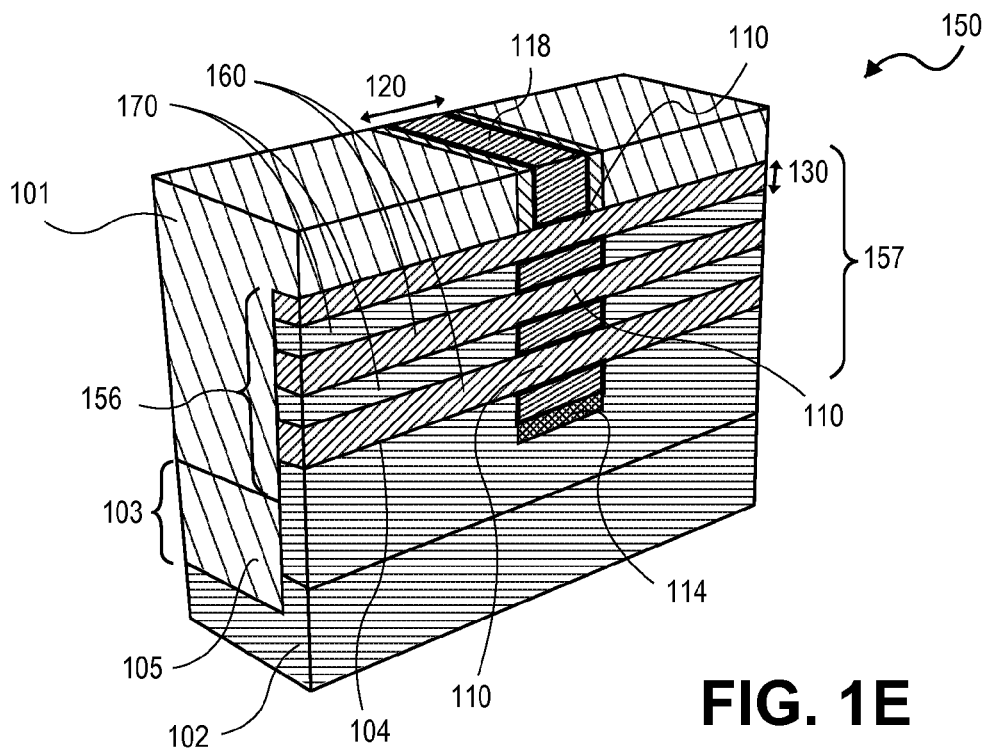
FIG. 1E is an illustration of a nonplanar gate all around device without embedded source and drain regions.

Additionally, although the semiconductor device 100 ideally includes embedded epi source 106 and drain 107 regions to enhance the strained in the channel nanowires 110 embodiments do not necessarily include embedded source and drain regions. In an embodiment of the present invention, as illustrated in FIG. 1E, a transistor 150 may include a source 156 and drain 157 region formed from a fin film stack used to create the uniaxially stressed channel nanowires 110. For example, source 156 and drain 157 regions may be formed from alternating layers of semiconductor material 160 and sacrificial material 170 (e.g., germanium and silicon germanium respectively) and the substrate 102 used to create stressed channel nanowires 110. In this case, source 156 and drain 157 regions are formed from a heterogeneous stack of single crystalline semiconductor films. The source 156 and drain 157 region may be doped to a desired conductivity type and level as is well known in the art. Additionally, if desired, raised source and drain regions may be formed by depositing additional epitaxial semiconductor material (not shown) on the source 156 and drain 157 regions to increase the thickness of the source and drain regions and decrease current crowding and thereby reduce the contact resistance of the device. Transistor 150 includes gate isolation 114 to isolate gate 118 beneath the bottom most nanowire 115 from capacitively coupling to substrate 102.

As shown in FIGS. 1B and 1C, gate dielectric layer 116 is formed on and all-around each channel nanowires 110. Gate dielectric layer 116 may be any well-known gate dielectric layer, such as, but not limited to SiO2, SiON, and SiN. In an embodiment, gate dielectric layer 116 is a high-k gate dielectric layer, such as a metal oxide dielectric (e.g., Ta2O5, TiO2, HfO2, HfSiOx, ZrO2 etc.). Gate dielectric layer 116 may also be other types of high-k dielectric layers, such as, but not limited to PZT and BST. The gate dielectric layer may also be any combination of the above dielectric materials. Gate dielectric layer 116 may be formed to a thickness between about 10-60 Å. In a specific embodiment, gate dielectric layer 116 is HfO2 and is formed to a thickness of between about 1-6 nanometers.

Gate electrode 118 is formed on gate dielectric layer 116 and completely surrounds each channel nanowire 110. Gate electrode 118 runs in a direction perpendicular to length 120 of channel nanowires 110. Gate electrode 118 may be formed of any suitable gate electrode material. In an embodiment, gate electrode 118 may be a metal gate electrode such as, but not limited to Ti, TiN, TaN, W, Ru, TiAl and any combination thereof. In an embodiment where device 100 is a NMOS transistor device, gate electrode 118 may be formed from a material having a work function between 3.9-4.2 eV. In an embodiment where device 100 is a PMOS transistor device, gate electrode 118 may be formed from a material having a work function between 4.8 to 5.2 eV. In an embodiment where channel nanowires 110 in device 100 are undoped or very lightly doped, gate electrode 118 may be formed from a material having a mid-gap work function between 4.3-4.7 eV. In a specific embodiment, gate electrode 118 is TiAl.

Because gate electrode 118 and gate dielectric layer 116 completely surround each channel nanowires 110, device 100 can be a transistor that operates in a fully depleted manner wherein when it is turned "ON", channel nanowires 110 fully deplete, thereby providing the advantageous electrical characteristics and performance of a fully depleted transistor device. When device 100 is turned "ON", a depletion region is formed in each channel nanowires 110 along with an inversion layer at the surface of each channel nanowire. The inversion layer has the same conductivity types as the embedded epi source 106 and drain 107 regions and forms a conductive channel between embedded epi source 106 and drain 107 regions to allow current to flow between them. The depletion region depletes free carriers from beneath the inversion layers. Each channel nanowire 110 is depleted of carriers except for the inversion layer, thus the transistor can be said to be a "fully depleted" transistor. Fully depleted transistors have improved electrical performance characteristics over non-fully depleted or partially depleted transistors. Operating a transistor in a fully depleted manner gives the transistor an ideal or very steep sub-threshold slope. A very steep sub-threshold slope results in improved short-channel effects such as improved drain induced barrier lowering (DIBL).

Figure 2:
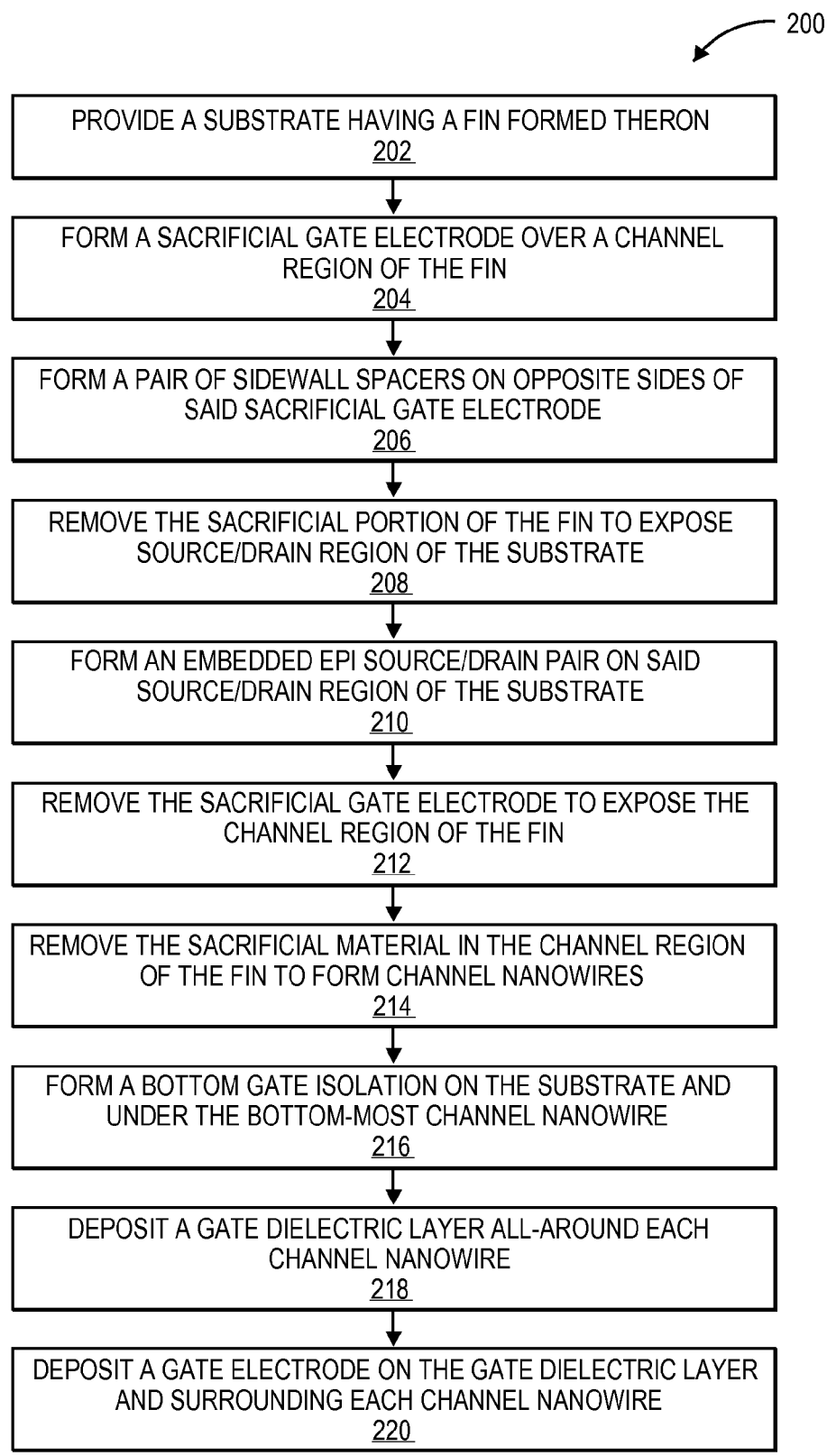
FIG. 2 is a flow chart representing steps in a method of forming a non-planar gate all-around device in accordance with an embodiment of the present invention.

FIG. 2 is a flow chart 200 representing a method of fabricating a non-planar gate all-around device, in accordance with an embodiment of the present invention. FIGS. 3A to 3M illustrate three-dimensional and two dimensional cross-sectional views representing the steps in a method of fabricating a non-planar gate all-around device, in accordance with an embodiment of the present invention. The method begins at step 202 in flow chart 200 by providing a substrate 301 having a fin 304 formed thereon. Substrate 301 is the material upon which the non-planar gate-all-around device is formed. Substrate 301 has a top surface 303 with a lattice constant. In an embodiment, substrate 301 includes a top single crystalline layer having a lattice constant. In one such embodiment, substrate 301 may comprise one or more buffer layers 311 grown between a distinct single crystalline substrate and the top single crystalline layer. The buffer layers 311 may serve to gradually change the lattice constant from that of the distinct crystalline substrate to that of the top single crystalline layer. The buffer layers 311 may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The distinct crystalline substrate on which the buffer layers 311 are formed may be any single crystalline material having a lattice constant (e.g., silicon, germanium, gallium arsenide, sapphire, etc.) In a particular embodiment, substrate 301 may comprise silicon germanium (SiGe) buffer layers epitaxially grown on a distinct single crystalline silicon substrate. The germanium concentration of the SiGe buffer layers may increase from 30% germanium for the bottom-most buffer layer to relaxed 70% germanium for the top-most buffer layer.

In an embodiment, fin 304 is formed having alternating layers of a semiconductor material 308 and a sacrificial material 310. The layers of semiconductor material 308 are subsequently formed into channel nanowires 343. The layers of sacrificial material 310 induce lattice stress on the layers of semiconductor material 308 by being lattice constant mismatched to the layers of semiconductor material 308. In an embodiment, the layers of semiconductor material 308 and the layers of sacrificial material 310 may be formed from any well-known material having a lattice constant. Ideally, the layers of semiconductor material 308 and the layers of sacrificial material 310 are formed from a single crystalline semiconductor material such as, but not limited to Si, Ge, SiGe, GaAs, InSb, GaP, GaSb, InAlAs, InGaAs, GaSbP, GaAsSb and InP. In an embodiment, the layers of semiconductor material 308 have a lattice constant different from the lattice constants of the layers of sacrificial material 310 and the top surface 303 of substrate 301. Fin 304 is lattice stressed as a result of the lattice mismatch between top surface 303, the layers of semiconductor material 308, and the layers of sacrificial material 310. In a particular embodiment, the lattice constant of the layers of semiconductor material 308 is larger than both the lattice constants of the layers of sacrificial material 310 and top surface 303. For example, the layers of semiconductor material 308 may be undoped germanium, the top surface 303 may be silicon germanium having 70% germanium concentration, and the layers of sacrificial material 310 may be silicon germanium having 70% germanium concentration. For such an embodiment, the lattice mismatch between the materials results in the layers of semiconductor material 308 being compressive lattice-stressed in fin 304. In another embodiment, the lattice constant of the layers of semiconductor material 308 is smaller than both the lattice constants of the layers of sacrificial material 310 and top surface 303. For example, the layers of semiconductor material 308 may be silicon, the top surface 303 may be silicon germanium, and the layers of sacrificial material 310 may be silicon germanium. For such an embodiment, the lattice constant between the materials results in the layers of semiconductor material 308 being tensile lattice-stressed in fin 304. Since the sacrificial material layer 310 and semiconductor material layer 308 alternate with differing lattice constants the semiconductor material layers are biaxially stressed by the underlying sacrificial material layer 310.

Figure 3A:
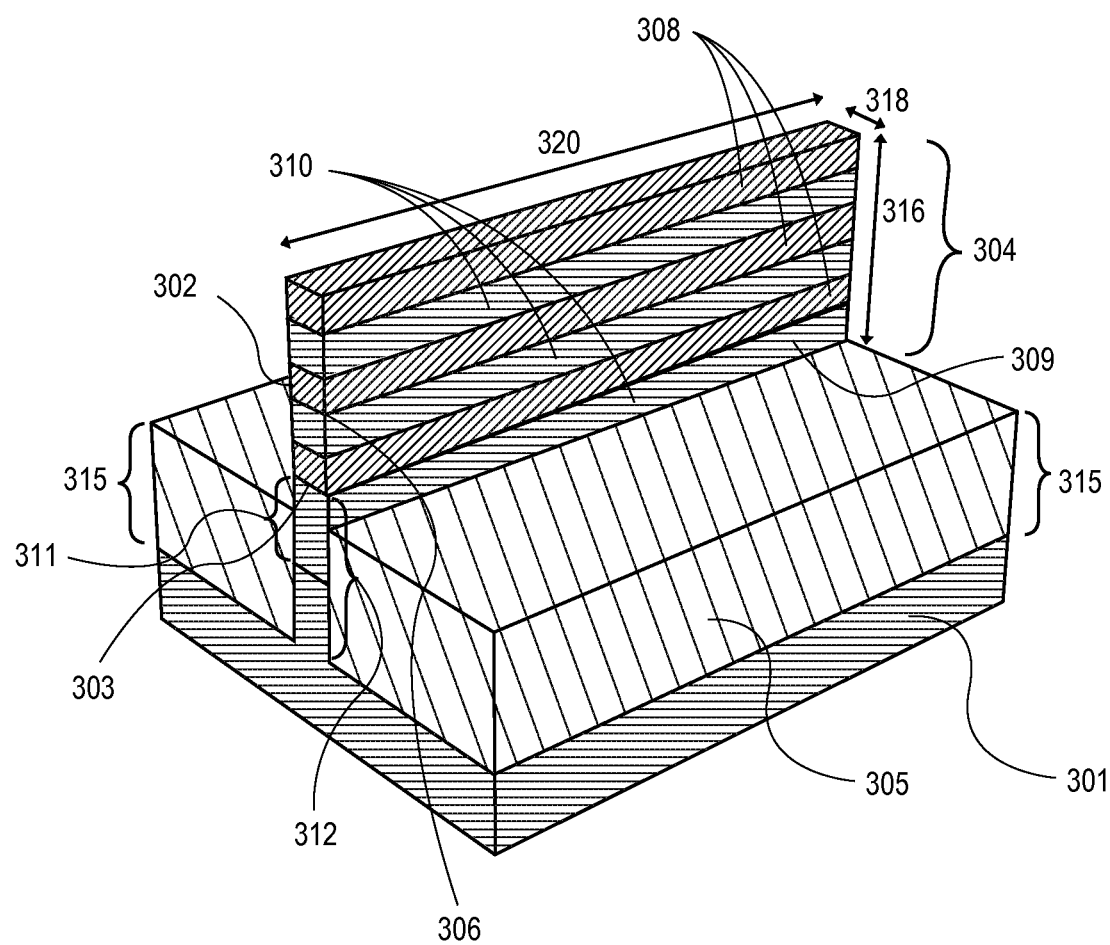
FIG. 3A to 3M illustrate the three dimensional and two dimensional views representing steps in a method of forming a non-planar gate all-around device in accordance with an embodiment of the present invention.

Fin 304 may be formed by first blanket depositing alternating layers of semiconductor material 308 and sacrificial material 310 on top surface 303 of substrate 301 using conventional epitaxial chemical vapor deposition methods. Next, the blanket layers of semiconductor material 308 and sacrificial material 310 are patterned using conventional photolithography and etching methods to define fin 304. In an embodiment of the present invention, substrate 301 is also etched so that the bottom portion of the fin 304 includes a substrate portion 309 as illustrated in FIG. 3A. In this way, the substrate portion 309 of the fin acts as the bottom sacrificial material 310 of the fin 304. In an embodiment the substrate portion 309 of fin 304 is made thicker than the sacrificial material layers 310 in order to provide additional room between the substrate and the bottom most channel nanowire so that a bottom gate isolation film and a gate electrode/gate dielectric may be formed between the substrate and bottom channel nanowires. During patterning, substrate 301 may also be patterned to form a substrate region 312 continuous with fin 304 and STI (shallow trench isolation) regions 315, in an embodiment. STI regions 315 serve to reduce current leakage between non-planar gate all-around devices formed adjacent to one another. In an embodiment, at least part of the substrate region 312 continuous with fin 304 may comprise buffer layers 311 of substrate 301. In an embodiment, STI regions 315 are filled with an STI dielectric layer 305. STI dielectric layer 305 may be any well-known dielectric such as but not limited to silicon oxide, silicon nitride, silicon oxynitride, a low-k dielectric, and any combination thereof. STI dielectric layer 305 is formed by first blanket depositing a STI dielectric layer 305 on substrate 301 and over fin 304 using conventional chemical vapor deposition methods. STI dielectric layer 305 is initially deposited to a thickness greater than the combined thicknesses of fin 304 and substrate region 312. Next STI dielectric layer 305 is planarized using a conventional chemical mechanical planarization method. STI dielectric layer 305 is then recessed using a conventional etch method to exposed fin 304 as shown in FIG. 3A. In an embodiment STI dielectric is recessed below the top surface 303 of the substrate 301 so that the bottom portion of fin 304 is formed from substrate 301 as illustrated in FIG. 3A. In this way, fin 304 includes a substrate portion 309 which acts as the bottom sacrificial material 310 of fin 304. In an embodiment, the substrate portion 309 of fin 304 is thicker than the sacrificial material layers 310 above in order to provide additional space between the substrate and the bottom most channel nanowire so that a bottom, gate isolation film and a gate electrode/gate dielectric may be formed between the substrate and the bottom channel nanowire. Alternatively a distinct sacrificial layer may be formed between top surface 303 and bottom most semiconductor material layer 308.

Fin 304 has sidewalls 302 and 306, a fin height 316, a fin width 318, and a fin length 320. In the formation of fin 304, sidewalls 302 and 306 are unconstrained planes, which allows fin 304 to lattice-relax in the direction perpendicular to fin length 320. That is, the above described biaxially stressed layers are reduced to essentially uniaxially stressed layers upon fin formation. In an embodiment, fin 304 is uniaxially lattice stressed in a direction parallel to fin length 320 and lattice relaxed in a direction perpendicular to the fin length 320. In an embodiment, fin 304 is formed having a fin width 318 less than 30 nm and ideally less than 25 nm. In an embodiment, fin height 316 is less than the height where integration issues, such as fin toppling, fin profile distortion, and poor uniformity in fin critical dimensions, begin to occur. In a particular embodiment, fin height 316 is between 30-75 nm.

The thicknesses of the layers of semiconductor material 308 and the layers of sacrificial material 310 influence the electrical characteristics of the channel nanowires 343 and the integration and performance of device 100. In an embodiment, the layers of semiconductor material 308 are sufficiently thick to avoid forming channel nanowires 343 having excessive surface scattering and thus high channel resistance and low carrier mobility. The layers of semiconductor material 308 are also sufficiently thin to form channel nanowires 343 that allow device 100 to operate in a fully depleted manner. The thicknesses of the layers of sacrificial material 310 affect the subsequent spacing between channel nanowires 343 and thus the ability of gate dielectric layer 350 and gate electrode 352 to form all-around each channel nanowire 343. In an embodiment, layers of sacrificial material 310 are sufficiently thick such that the gate dielectric layer 350 may subsequently form all-around the channel nanowires 343 and the gate electrode 352 may form on the gate dielectric layer 350 to completely surround the channel nanowires 343. The thicknesses of the layers of semiconductor material 308 and the layers of sacrificial material 310 also affect fin height 316. In an embodiment, the layers of semiconductor material 308 and the layers of sacrificial material 310 are sufficiently thin to achieve a fin height 316 that is less than the height when integration issues begin to occur. In a particular embodiment, the layers of semiconductor material 308 are formed to a thickness between about 5-50 nm and the layers of sacrificial material 310 are formed to a thickness between about 5-30 nm.

The total number of alternating layers of semiconductor material 308 and sacrificial material 310 affect the fin height 316 and the drive current capacity of the device. The number of layers of semiconductor material 308 corresponds to the number of channel nanowires 343 subsequently formed. Larger numbers of channel nanowires 343 allow for greater drive current capacity of device 100. However, too many layers of semiconductor material 308 and sacrificial material 310 result in a fin height 316 that is not integratable. In an embodiment, the number of layers 308 and 310 is sufficiently low to achieve a fin height 316 that is integratable. In a particular embodiment, fin 304 has about 3-6 layers of semiconductor material 308 and about 3-6 layers of sacrificial material 310.

Figure 3B:
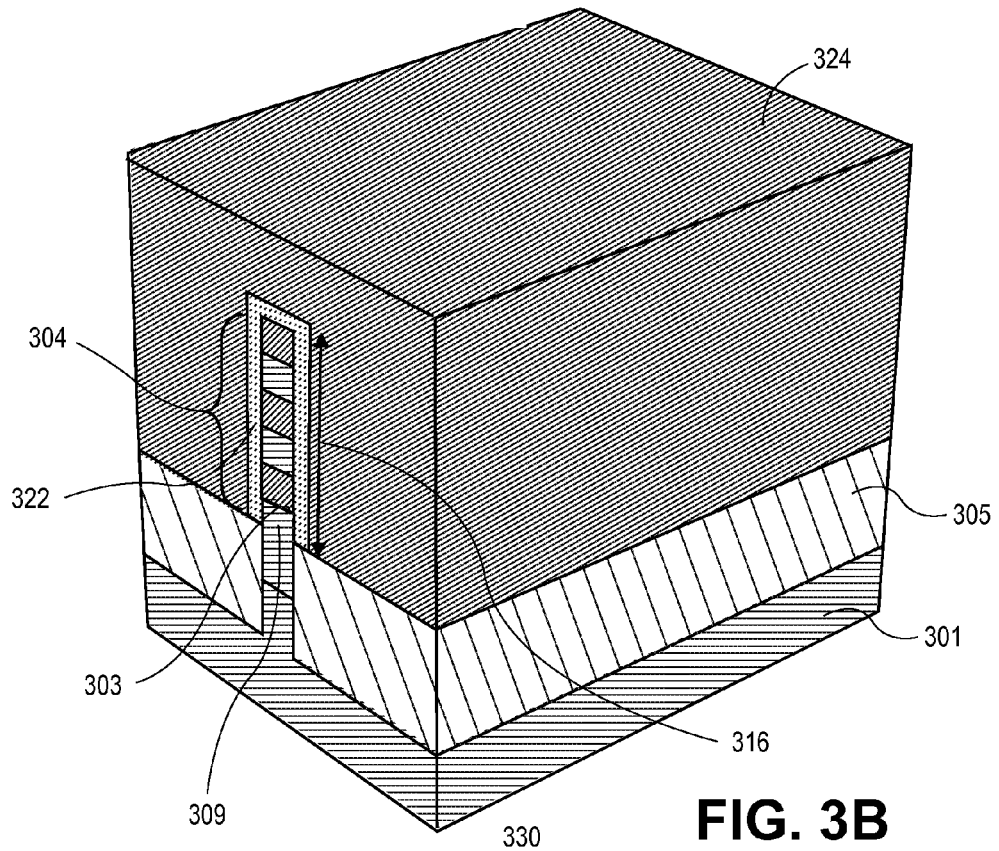
Figure 3C:
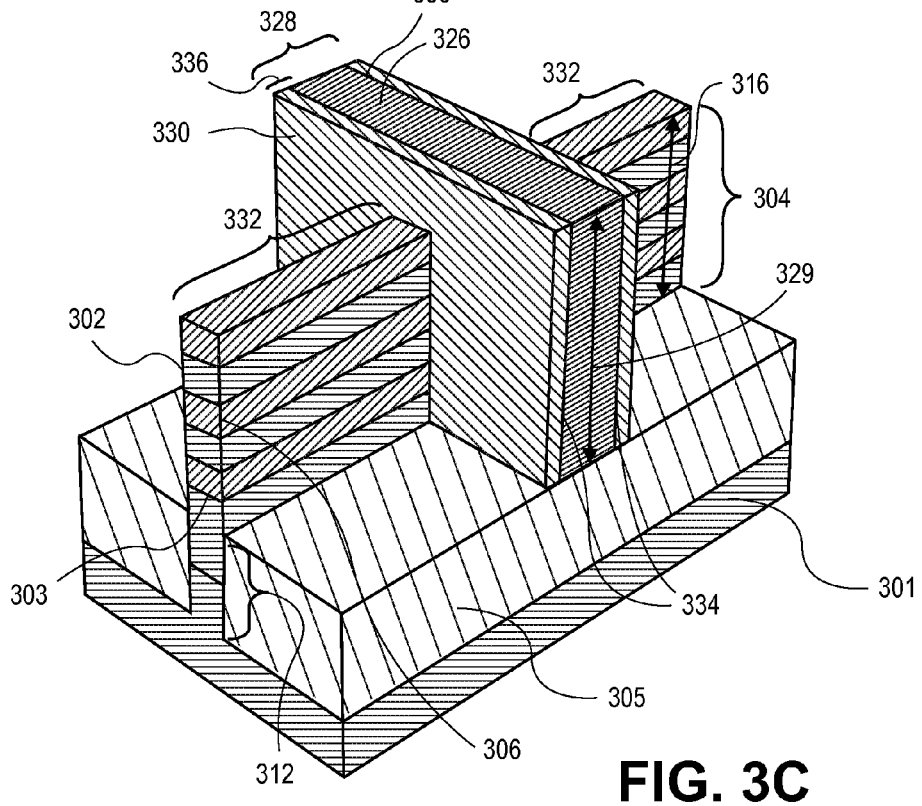

Referring to step 204 in flow chart 200 and corresponding FIGS. 3B and 3C, a sacrificial gate electrode 352 is formed over the channel region 328 of fin 304. The sacrificial gate electrode 352 defines the channel region of the transistor device. The sacrificial gate electrode 352 is formed by first blanket depositing a sacrificial gate dielectric layer 322 on fin 304. Sacrificial gate dielectric layer 322 deposits on the top and sidewalls 302, 306 of fin 304. Sacrificial gate dielectric layer 322 may be deposited to a thickness between about 10-50 Å. As shown in FIG. 3B, a sacrificial gate layer 324 is then blanket deposited on the sacrificial gate dielectric layer 322 and over fin 304. Sacrificial gate layer 324 is deposited to a thickness that exceeds fin thickness 316. Sacrificial gate layer 324 may be planarized using conventional chemical mechanical planarization methods. Next, as shown in FIG. 3C, sacrificial gate 326 is formed by patterning the sacrificial gate layer 324 using conventional photolithography and etching methods. Sacrificial gate electrode 326 is formed over the channel region 328 of fin 304 and has a thickness 329 that is greater than the fin height 316. Sacrificial gate electrode 326 subsequently serves to protect the channel region 328 of fin 304 during the removal of sacrificial portions 332 of fin 304.

During the patterning of the sacrificial gate electrode, the sacrificial gate dielectric layer 322 on sacrificial portions 332 of fin 304 are exposed on opposite sides of sacrificial gate electrode 352. Sacrificial gate dielectric layer 322 serves as an etch stop layer during the patterning and formation of sacrificial gate electrode 326, thereby preventing fin 304 from being damaged. In an embodiment, sacrificial gate dielectric layer 322 and sacrificial gate layer 324 are formed from materials have sufficiently different etch selectivity where sacrificial gate dielectric layer 322 may serve as an etch stop layer for etching sacrificial gate layer 324. In a particular embodiment, sacrificial gate dielectric layer 322 is a dielectric layer (e.g., silicon oxide, silicon nitride, and silicon oxynitride) and sacrificial gate layer 324 is formed from a semiconductor material (e.g., polycrystalline silicon). Sacrificial gate dielectric layer 322 and sacrificial gate layer 324 may be deposited using conventional chemical vapor deposition methods. Next, sacrificial gate dielectric layer 322 is removed from the top and sidewalls 302, 306 of the sacrificial portions 332 of fin 304 using a conventional wet etch process to expose the sacrificial portions 332 of fin 304. In the embodiment where sacrificial gate dielectric layer 322 is a silicon oxide layer, sacrificial gate dielectric layer 322 is removed using a dilute HF wet etch.

Referring to step 206 in flow chart 200 and corresponding FIG. 3C, a pair of sidewall spacers 330 are formed on opposite sidewalls 334 of sacrificial gate electrode 326. The pair of sidewall spacers 330 may be formed using conventional methods of forming selective spacers known in the art. In an embodiment, a conformal dielectric spacer layer, such as, but not limited to, silicon oxide, silicon nitride, silicon oxynitride and combinations thereof, is first blanket deposited on all structures, including fin 304 and sacrificial gate electrode 326. The dielectric spacer layer is deposited in a conformal manner so that it forms to substantially equal thicknesses on both vertical surfaces, such as the sidewalls 302, 306, 334, and horizontal surfaces, such as the top of the sacrificial gate electrode 326. The dielectric spacer layer may be deposited using conventional chemical vapor deposition methods such as low pressure chemical vapor deposition (LPCVD) and plasma enhanced chemical vapor deposition (PECVD). In an embodiment, the dielectric spacer layer is deposited to a thickness of between about 2-10 nanometers. Next, an unpatterned anisotropic etch is performed on the dielectric spacer layer using conventional anisotropic etch methods, such as reactive ion etching (RIE). During the anisotropic etching process, most of the dielectric spacer layer is removed from horizontal surfaces, leaving the dielectric spacer layer on the vertical surfaces such as the sidewalls 334 of sacrificial gate electrode 326 and the sidewalls 302, 306 of fin 304. Because the thickness 329 of sacrificial gate electrode 326 is greater than fin height 316, the thickness of the remaining dielectric spacer layer after the anisotropic etch is greater on the sidewalls 334 of sacrificial gate electrode 326 than on the sidewalls 302, 306 of fin 304. It is this thickness difference that allows the selective formation of sidewall spacers 330 on the sidewalls 334 of sacrificial gate electrode 326. Next, an unpatterned isotropic etch is performed to remove the remaining dielectric spacer layer from the sidewalls 302, 306 of fin 304, leaving a pair of sidewall spacers 330 on opposite sidewalls 334 of sacrificial gate electrode 326. In an embodiment, the isotropic etch is a wet etch process. In a specific embodiment, where the dielectric spacer layer is silicon nitride or silicon oxide, the isotropic etch employs a wet etchant solution comprising phosphoric acid (H3PO4) or a buffered oxide etch (BOE), respectively. In an alternate embodiment, the isotropic etch is a dry etch process. In one such embodiment, NF3 gas is employed in a downstream plasma reactor to isotropically etch the dielectric spacer layers.

Figure 3D:
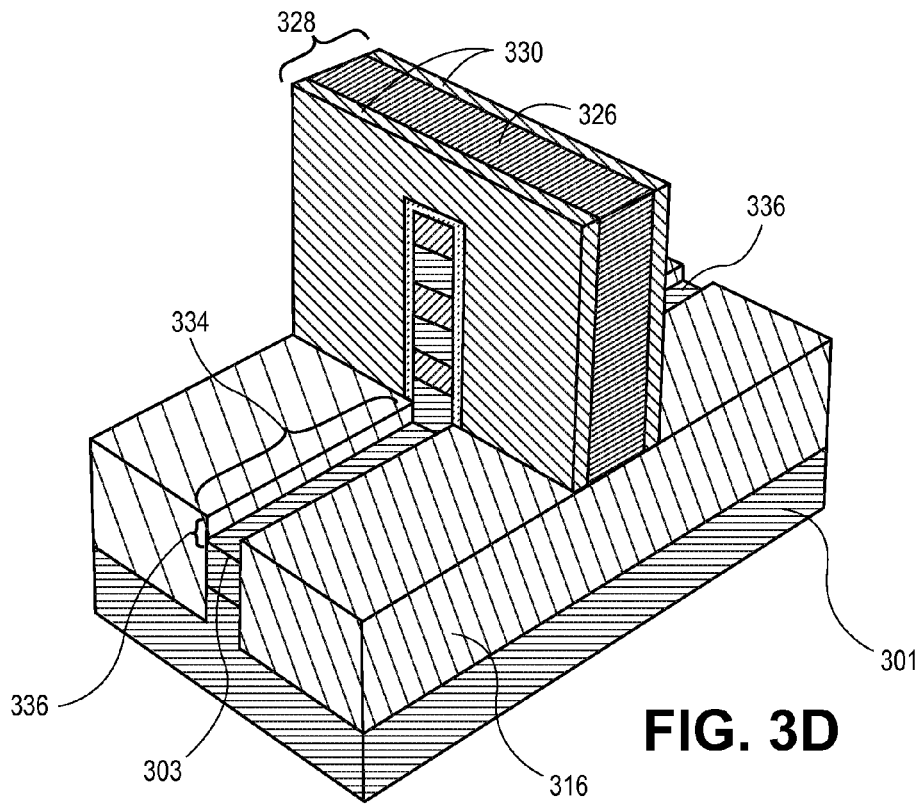

Referring to step 208 in flow chart 200 and corresponding FIG. 3D, the sacrificial portions 332 of fin 304 are removed to expose the source/drain region 334 of substrate 301. The sacrificial portion 332 of fin 304 may be removed using convention etching methods such as wet etching or plasma dry etching. In an embodiment where fin 304 comprises alternating layers of germanium 308 and silicon germanium 310, a wet etchant such as ammonium hydroxide (NH4OH) or tetramethylammonium hydroxide (TMAH) solution is used to selectively etch off the sacrificial portion 332 of fin 304. The channel region 328 of fin 304 is protected from etching by the sacrificial gate 326 and the pair of sidewall spacers 330. In an embodiment, top surface 303 of substrate 301 is recessed during the removal of the sacrificial portion 332 of fin 304 to form a source/drain trench 336. The source/drain trench 336 serves to contain the subsequent growth of the embedded epi source 338 and drain 339 regions. In an embodiment, the source/drain trench 336 is formed to a depth of between 20 and 40 nm. Alternatively, the sacrificial portions 332 of fin 304 is removed so that the top surface 303 of substrate 301 is above or planar with STI dielectric layer 305.

Figure 3E:
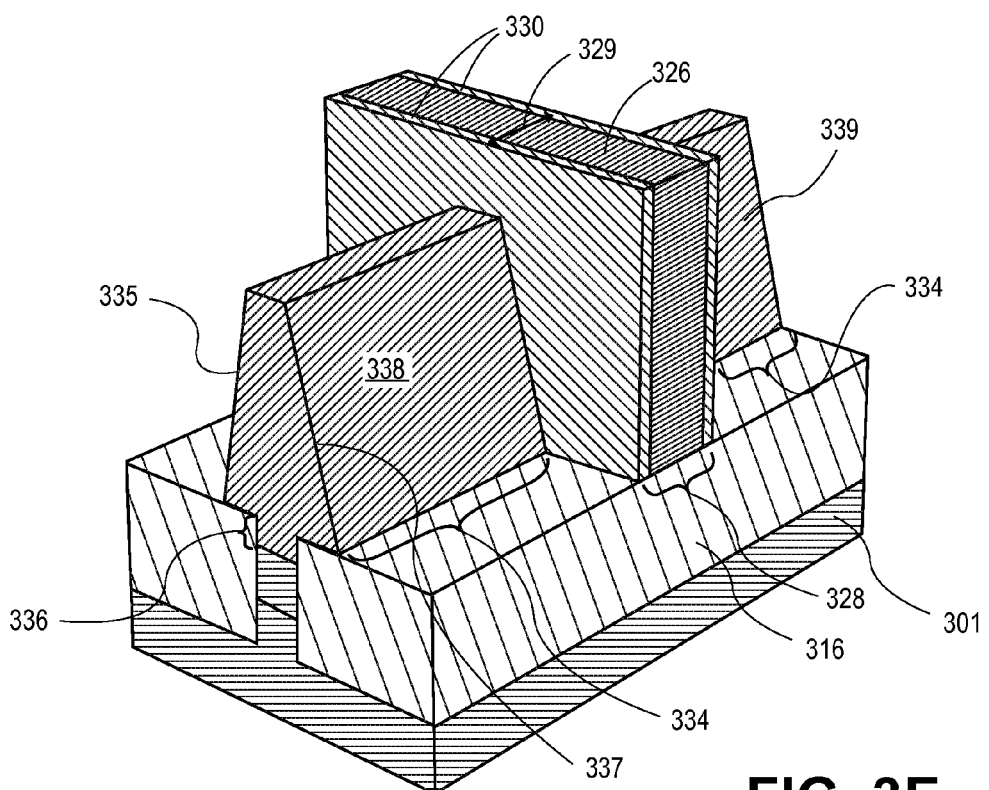

Referring to step 210 in flow chart 200 and corresponding FIG. 3E, embedded epi source 338 and drain 339 regions are formed on the source/drain regions 334 of substrate 301. In an embodiment, the embedded epi source 338 and drain 339 regions are formed using conventional epitaxial deposition methods such as low pressure chemical vapor deposition, vapor phase epitaxy, and molecular beam epitaxy. In an embodiment, the embedded epi source 338 and drain 339 regions form in the source/drain trench 336. Embedded epi source 338 and drain 339 regions couple with the channel region 328 of fin 304 and rises above the top surface of the STI dielectric layer 305. Embedded epi source 338 and drain 339 regions may be formed from any well-known material having a lattice constant. Ideally, embedded epi source 338 and drain 339 regions are formed from a single crystalline semiconductor material such as, but not limited to Si, Ge, SiGe, GeSn, GaAs, InSb, GaP, GaSb, InAlAs, InGaAs, GaSbP, GaAsSb, GaN, GaP, and InP. In an embodiment, embedded epi source 338 and drain 339 regions are formed from a single crystalline semiconductor material having a lattice constant different from top surface 303 of substrate 301. In a particular embodiment, embedded epi source 338 and drain 339 regions have a lattice constant greater than the lattice constant of top surface 303 of substrate 301.

In a specific embodiment, embedded epi source 338 and drain 339 regions are formed from germanium and top surface 303 of substrate 301 is silicon germanium. In an embodiment of the present invention, embedded epi source 338 and drain 339 are formed from the same semiconductor material (e.g., Ge) used to form the channel nanowires of the transistor. In an embodiment of the present invention, the embedded epi source 338 and drain 339 regions are formed from a material (e.g., GaAs) having a lattice constant greater than the semiconductor material (e.g., SiGe) of the top surface 303 of substrate 301 and greater than the lattice constant of the semiconductor material (e.g., Ge) 308 used to form channel nanowires in order to further enhance the uniaxial compressive lattice stress in the channel nanowires.

In another specific embodiment, embedded epi source 338 and drain 339 regions are formed from silicon and top surface 303 of substrate 301 is silicon germanium. In an embodiment of the present invention, embedded epi source 338 and drain 339 are formed from the same semiconductor material (e.g., Si) used to form the channel nanowires of the transistor. In an embodiment of the present invention, the embedded epi source 338 and drain 339 regions are formed from a material (e.g., silicon carbide or carbon-doped silicon) having a lattice constant less than the semiconductor material (e.g., SiGe) of the top surface 303 of substrate 301 and less than the lattice constant of the semiconductor material (e.g., Si) 308 used to form channel nanowires in order to further enhance the uniaxial tensile lattice stress in the channel nanowires.

The lattice constant mismatch between the embedded epi source 338 and drain 339 regions and top surface 303 of substrate 301 creates lattice stress where embedded epi source 338 and drain 339 regions are uniaxially lattice stressed in a direction parallel to the length 320 of the fin 304. The embedded epi source 338 and drain 339 regions are lattice relaxed in a direction perpendicular to the length 329 of the fin 304 because the planes corresponding to sidewalls 335 and 337 are unconstrained during the formation of the embedded epi source 338 and drain 339 regions. The lattice constant mismatch also causes embedded epi source 338 and drain 339 regions to exert a force on the channel region 328 of fin 304. Because the layers of semiconductor material 308 in the channel region 328 of fin 304 will subsequently become the channel nanowires 343, the embedded epi source 338 and drain 339 regions will subsequently exert a force on the channel nanowires 343 which may help to maintain the lattice stress in channel nanowires 343. In an embodiment, the lattice constant of embedded epi source 338 and drain 339 regions is larger than top surface 303 of substrate 301. In such an embodiment, embedded epi source 338 and drain 339 regions are compressive stressed and provides a compressive force on channel nanowires 343. In another embodiment the lattice constant of embedded epi source 338 and drain 339 regions is smaller than top surface 303 of substrate 301. In such an embodiment, embedded epi source 338 and drain 339 regions are tensile stressed and provides a tensile force on channel nanowires 343.

Overall, in an embodiment, an initial uniaxial stress is formed along the channel regions of nanowire-forming layers during fin patterning of a stack of nanowire-forming layers and intervening sacrificial layers. Embedded epi source and drain regions are then formed by etching away outer portions of the fin and subsequently forming epitaxial source and drain regions in their place. In one such embodiment, the embedded epi source and drain regions are grown from a crystalline surface of a substrate below the fin. In the case that the removed outer portion are heterogeneous with alternating nanowire-forming layers and intervening sacrificial layers of differing composition, replacement with embedded source and drain regions through epitaxial growth substitutes the heterogeneous portions with regions homogeneous in composition. Thus, a new lattice mismatch is added on either side of the etched fin. The embedded epi source and drain regions, then, further enhance the uniaxial stress already present in the nanowire-forming layers. Furthermore, upon subsequent removal of the intervening sacrificial layers, the embedded epi source and drain regions act to anchor the then formed discrete nanowires. Since, the embedded epi source and drain regions are epitaxially grown from the underlying substrate, the anchoring is effective for maintaining the initial uniaxial stress formed along the channel regions of nanowire-forming layers during fin patterning. As such, the embedded epi source and drain regions both maintain and enhance the uniaxial stress of the ultimately formed nanowire channel portions. It is noted that the above substitution of heterogeneous layers with a homogeneous layer may be performed by using the same material as the nanowire-forming layers. However, in another embodiment, to further enhance the uniaxial stress, a material different from any of the materials used in the heterogeneous stack of layers may be epitaxially grown to form the embedded epi source and drain regions. For example, in one embodiment, the epitaxial source and drain regions are formed from a material having a lattice constant greater than any of the materials in the heterogeneous fin. In that embodiment, a uniaxial compressive stress is further enhanced in the ultimately formed nanowire channel portions. In another embodiment, the epitaxial source and drain regions are formed from a material having a lattice constant less than any of the materials in the heterogeneous fin. In that embodiment, a uniaxial tensile stress is further enhanced in the ultimately formed nanowire channel portions.

In an embodiment, the top surface 303 of the source/drain regions 334 of substrate 301 is a single crystalline material having a <100>-orientation that serves as a seed layer for epitaxial growth of embedded epi source 338 and drain 339 regions. Embedded epi source 338 and drain 339 regions thus grow in a <100>-orientation. The <111> plane corresponding to sidewalls 335 and 337 may grow at a more favorable rate during the formation of embedded epi source 338 and drain 339 regions and result in the embedded epi source 338 and drain 339 regions being <111>-faceted.

It is to be appreciated that although it is desired to form embedded epi source 338 and drain 339 regions by etching away the sacrificial portion 332 of fin 304 and then growing epi to form source and drain regions, as shown in FIGS. 3D and 3D, in order to enhance the stressing of the channel nanowires, it is not necessary to do so. In an alternative embodiment, the sacrificial portions 332 of fin 304 are not etched away and are maintained to form the source and drain regions for the device, such as illustrated in FIG. 1E. The sacrificial portion 332 of fin 304 may be doped, at this time, by well known techniques, such as ion implantation to form source and drain regions of a desired conductivity type and concentration level. Additionally, an epitaxial semiconductor film may be grown on the top and sidewalls of the sacrificial portions 334 of fin 304 to form raised source and drain regions to decrease current crowding if desired.

Figure 3F:
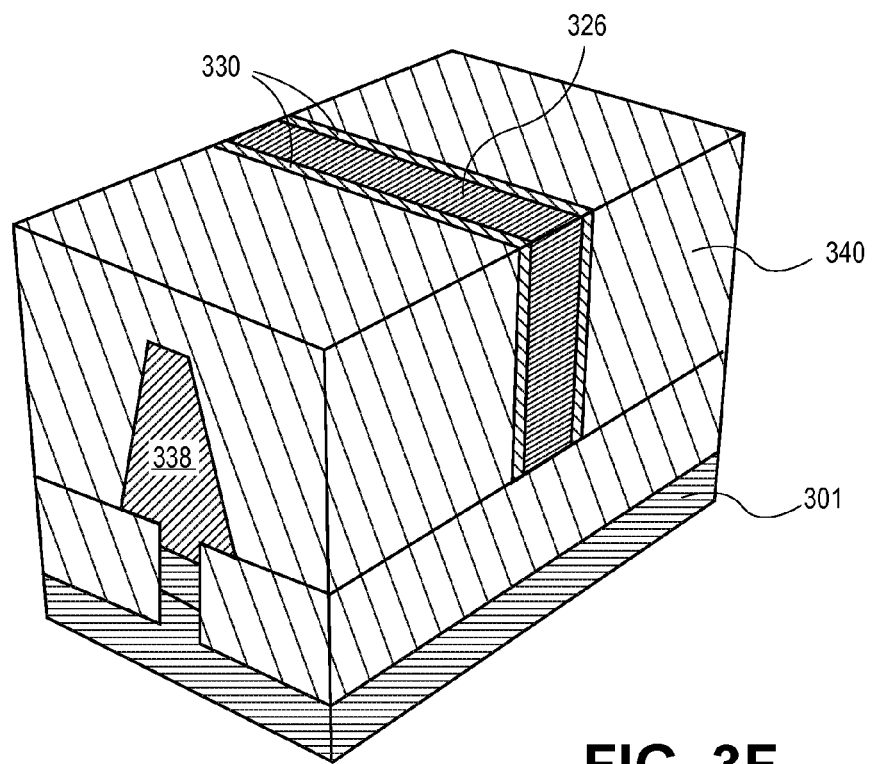

Next, referring to FIG. 3F, an inter-layer dielectric (ILD) layer 340 is blanket deposited over all structures, including the raise source 338 and drain 339 regions, the sacrificial gate electrode 326, and the pair of sidewall spacers 334. The blanket ILD layer 340 may be deposited using a conventional chemical vapor deposition method (e.g., plasma enhance chemical vapor deposition and low pressure chemical vapor deposition). In an embodiment, ILD layer 340 is formed from any well-known dielectric material such as, but not limited to undoped silicon oxide, doped silicon oxide (e.g., BPSG, PSG), silicon nitride, and silicon oxynitride. ILD layer 340 is then polished back using a conventional chemical mechanical planarization method to expose the top of the sacrificial gate electrode 326 and the top of the pair of sidewall spacers 334.

Figure 3G:
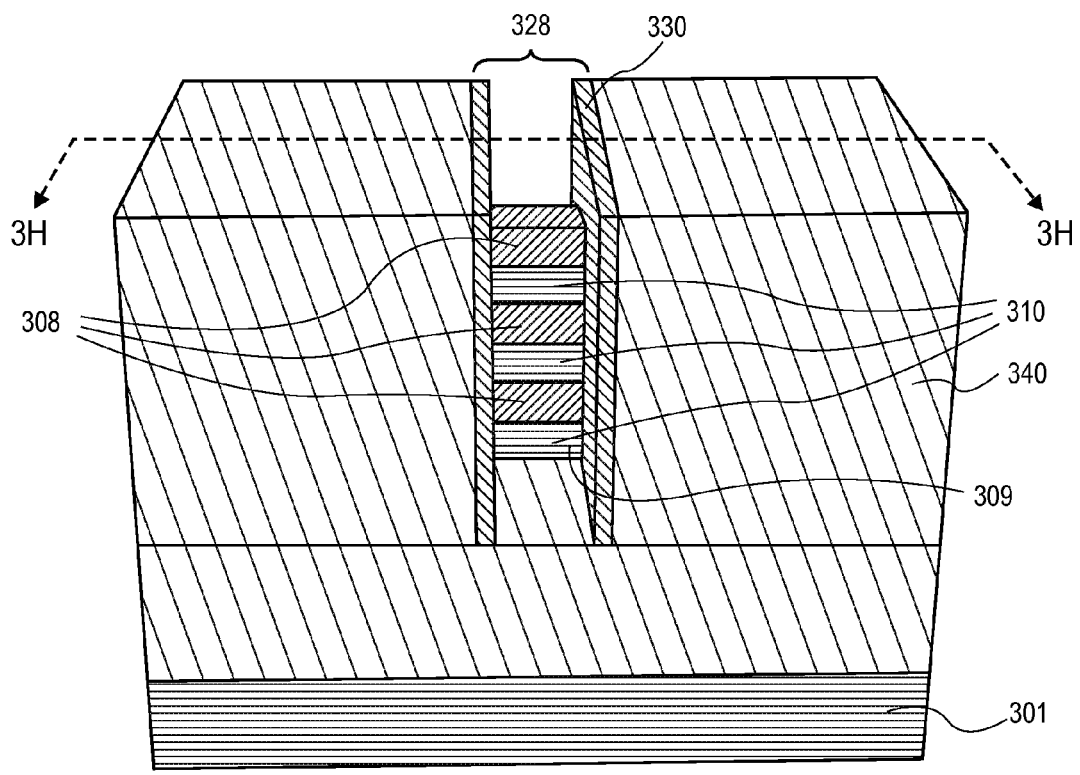
Figure 3H:
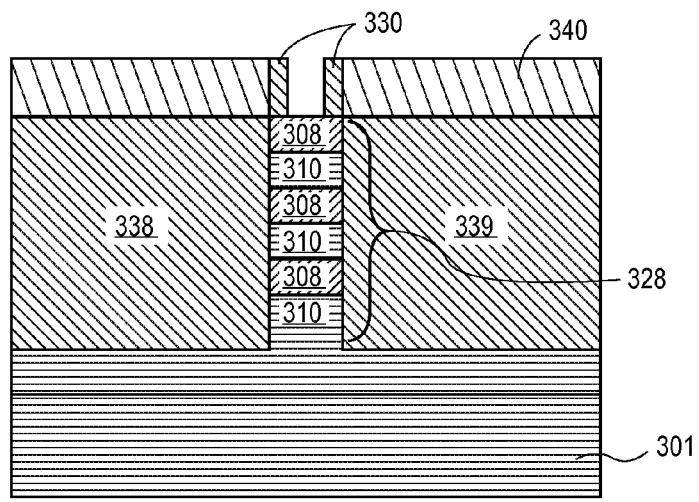

Referring to step 212 in flow chart 200 and corresponding FIGS. 3G and 3H, sacrificial gate electrode 326 is removed to expose the channel region 328 of fin 304. FIG. 3H is the two dimensional corresponding cross-sectional view of FIG. 3H. ILD layer 340 protects embedded epi source 338 and drain 339 regions during the removal of the sacrificial gate electrode 326. Sacrificial gate electrode 326 may be removed using a conventional etching method such a plasma dry etch or a wet etch. In an embodiment where sacrificial gate electrode 326 is polysilicon and ILD layer 340 is silicon oxide, a wet etchant such as a TMAH solution may be used to selectively remove the sacrificial gate electrode 326. The sacrificial gate dielectric layer 322 on the channel region 328 of fin 304 serves as an etch stop and protects the channel region 328 of fin 304 during the removal of sacrificial gate electrode 326. Next, sacrificial gate dielectric layer 322 is removed using a conventional etching method to expose the channel region 328 of fin 304 prior to step 214 in flow chart 200. In an embodiment where sacrificial gate dielectric layer 322 is silicon oxide, a dilute HF wet etch may be used to removed sacrificial gate dielectric layer 322.

Figure 3I:
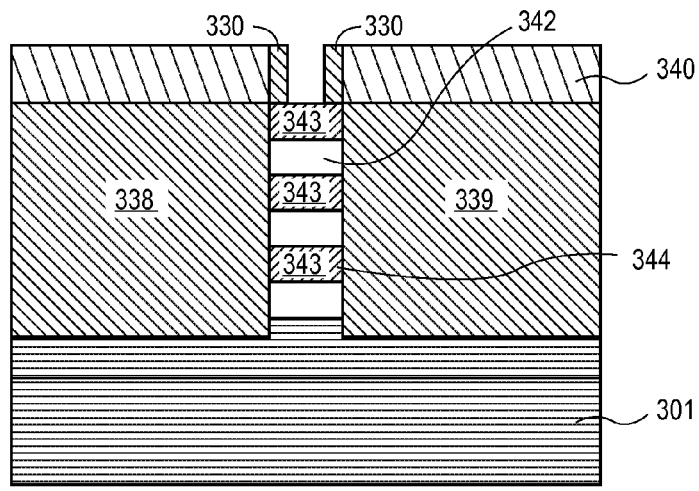

Referring to step 214 in flow chart 200 and corresponding FIG. 3I, the layers of sacrificial material 310 are removed between the layers of semiconductor material 308 in the channel region 328 of fin 304 to form channel nanowires 343. The layers of sacrificial material 310 may be removed using any well-known etchant that is selective to the layers of semiconductor material 308 where the etchant etches the layers of sacrificial material 310 at a significantly higher rate than the layers of semiconductor material 308. In an embodiment, the etchant selectively etches the layers of semiconductor material 308 while not etching the layers of sacrificial material 310. In an embodiment where the layers of semiconductor material 308 are germanium and the layers of sacrificial material 310 are silicon germanium, the layers of sacrificial material 310 may be selectively removed using a wet etchant such as, but not limited to ammonium hydroxide (NH4OH), tetramethylammonium hydroxide (TMAH), ethylenediamine pyrocatechol (EDP), or potassium hydroxide (KOH) solution. In an embodiment where the layers of semiconductor material 308 are silicon and the layers of sacrificial material 310 are silicon germanium, the layers of sacrificial material 310 may be selectively removed using a wet etchant such as, but not limited to aqueous carboxylic acid/nitric acid/HF solution and aqueous citric acid/nitric acid/HF solution. The removal of the layers of sacrificial material 310 leaves voids 342 between the layers of semiconductor material 308. The voids 342 between the layers of semiconductor material 308 have a thickness of between about 5-30 nm. The remaining layers of semiconductor material 310 form a vertical array of channel nanowires 343 that are coupled to embedded epi source 338 and drain 339 regions. The channel nanowires 343 formed have a thickness of between about 5-50 nm. The channel nanowires 343 run parallel to top surface 303 and are aligned with each other to form a single column of channel nanowires 343 with a bottom-most channel nanowire 344 at the very bottom of the column.

In an embodiment, as shown in FIG. 3I, all of the sacrificial material 310 between the embedded epi source and drain regions is removed, including the portions beneath sidewall spacers 330. Etching the portions beneath the spacers simplifies manufacturing because the removal of the sacrificial material 310 can be based on the selectively of the etch with respect to the sacrificial material and embedded epi source and drain regions enabling an over etch to be used to remove the sacrificial material. Removal of the sacrificial material 310 beneath the spacer 330, however, may result in a slightly larger opening formed between spacer 330 above the top most channel nanowire 343. This may result in the subsequently formed gate electrode having slightly larger gate length between the channel nanowires as compared to gate length above the top most channel nanowire. In an embodiment, a timed etch is utilized so that a portion of the sacrificial material 310 adjacent to the embedded epi source and drain regions remains beneath the spacers 330 after etching sacrificial material 310 to form channel nanowires 343. In this way, the subsequently formed gate electrode may have the same gate length adjacent to all surfaces of the channel nanowires.

Figure 3J:
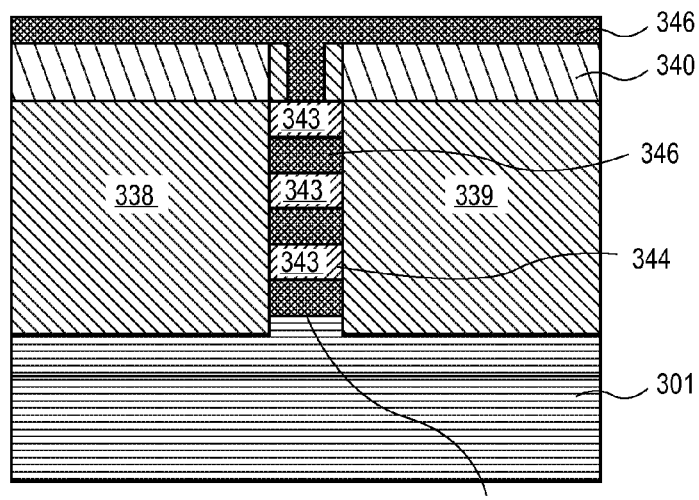
Figure 3K:
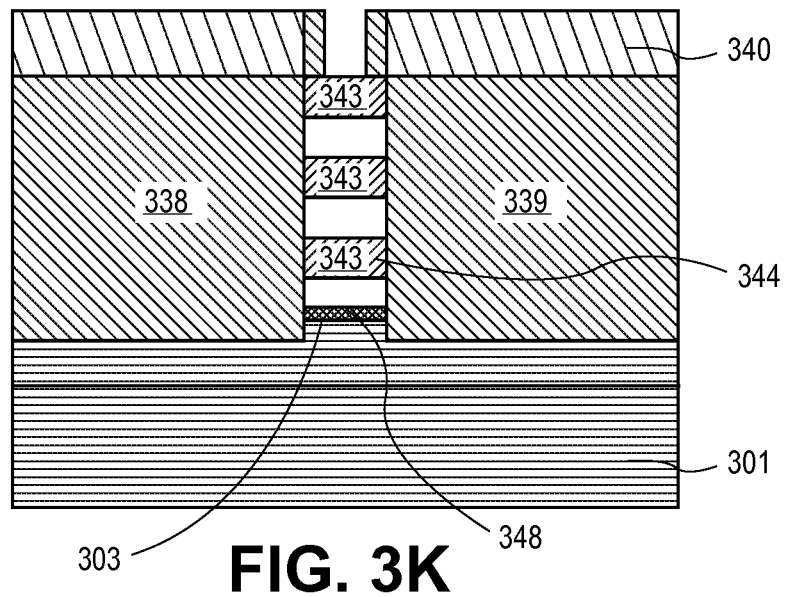

Referring to step 216 in flow chart 200 and corresponding FIGS. 3J and 3K, a bottom gate isolation 348 is formed on the top surface 303 of substrate 301 and under the bottom-most channel nanowire 344. The bottom gate isolation 348 is formed by first blanket depositing a dielectric layer 346 around and over the channel nanowires 343 as shown in FIG. 3J. The dielectric layer 346 completely fills the voids 342 between the channel nanowires 343, including the region between the bottom-most channel nanowire 344 and the top surface 303 of substrate 301. Dielectric layer 346 also forms on the top surface of the ILD layer 340. In an embodiment, dielectric layer 346 is formed from any well-known dielectric material such as, but not limited to silicon oxide, silicon nitride, and silicon oxynitride. In a specific embodiment, dielectric layer 346 is formed from silicon oxide. Ideally, dielectric layer 346 is formed using a highly conformal deposition method such as low pressure chemical vapor deposition (LPCVD), atomic layer deposition (ALD), or spin-on-dielectric process to ensure that the voids 342 between the channel nanowires 343 are completely filled. Next, as shown in FIG. 3K, the dielectric layer 346 is recessed from the top downward using a conventional isotropic dielectric etching method. In a particular embodiment where the dielectric layer 346 is silicon oxide, a timed HF wet etch method is used to recess dielectric layer 346. During the recess of dielectric layer 346, the majority of the dielectric layer 346 is removed, leaving behind a thin layer on top surface 303 of substrate 301 and under the bottom-most channel nanowire 344 that forms the bottom gate isolation 348. The thickness of the bottom gate isolation 348 depends on the length of time that the dielectric layer 346 is recessed. In an embodiment, the recess is performed for a sufficiently long time to achieve a bottom gate isolation thickness that is sufficiently thick to isolate the top surface 303 of substrate 301 from capacitive coupling by gate electrode 352. In an embodiment, the recess is performed for a sufficiently long time to achieve a bottom gate isolation thickness that is sufficiently thin such that the void between the bottom-most channel nanowire 344 and the bottom gate isolation 348 is large enough for the gate dielectric layer 350 to formed all-around the bottom-most channel nanowire and for the gate electrode 352 to form around the bottom-most channel nanowire 344. In an embodiment, the thickness of the bottom gate isolation 348 formed is sufficiently thick to isolate the top surface 303 of substrate 301 from capacitive coupling by gate electrode 352 and sufficiently thin for gate dielectric layer 350 and gate electrode 352 to surround the bottom-most channel nanowire 344. In a particular embodiment, the thickness of bottom gate isolation 348 is between about 100-300 A.

Figure 3L:
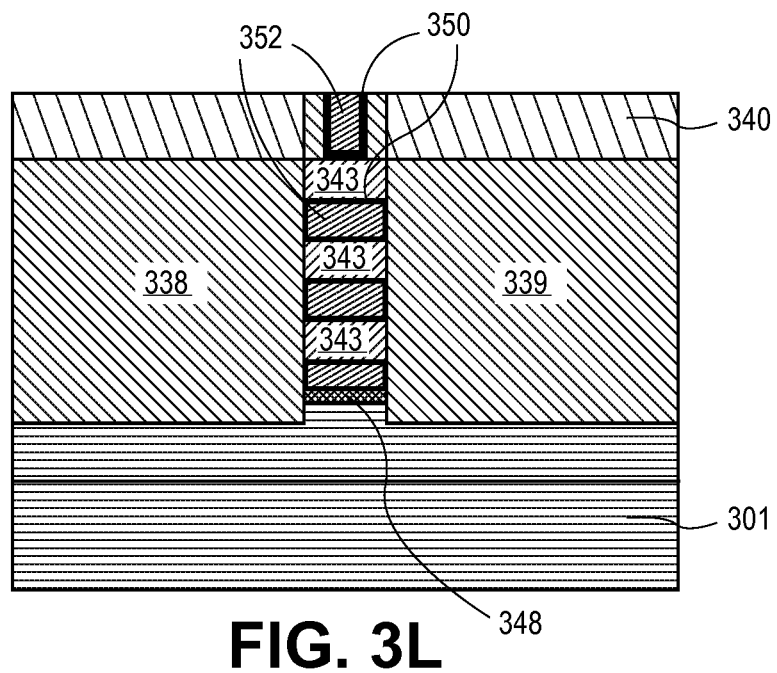
Figure 3M:
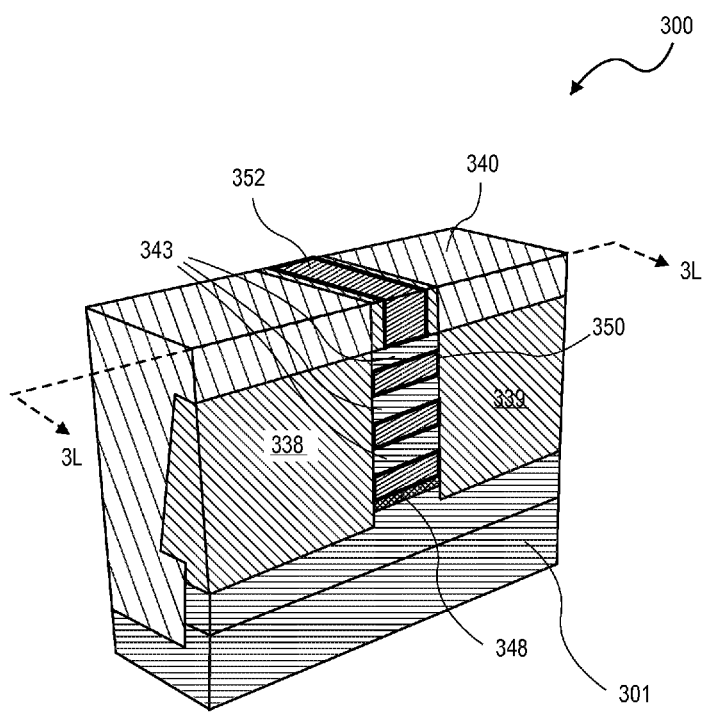

Referring to steps 218 and 220 in flow chart 200 and corresponding FIGS. 3L and 3M, a gate dielectric layer 350 is formed around each channel nanowire 343 and a gate electrode 352 is formed on the gate dielectric layer 350 and surrounds each channel nanowire 343. FIG. 3M is the corresponding three dimensional cross-sectional view of FIG. 3L. Gate dielectric layer 350 may be formed from any well-known gate dielectric material as previously described. The gate dielectric layer 350 is formed using a highly conformal deposition process such as atomic layer deposition (ALD) in order to ensure the formation of a gate dielectric layer having a uniform thickness around each channel nanowire 343. In a particular embodiment, the gate dielectric layer is HfO2 and is deposited to a thickness between 1-6 nanometers. The gate dielectric layer 350 is blanket deposited and also forms on the top surface of ILD layer 340. Next, a gate electrode material is blanket deposited on the gate dielectric layer 350 to form gate electrode 352. Gate electrode 352 may be formed from any well-known gate electrode material as previously described. The gate electrode material is deposited using a conformal deposition process such as atomic layer deposition (ALD) to ensure that gate electrode 352 is formed on the gate dielectric layer 350 and around and between each channel nanowire 343. The blanket gate electrode material and gate dielectric layer 350 deposited on the top of ILD layer 340 are then chemically mechanically planarized until the top surface of the ILD layer 340 is revealed as shown in FIGS. 3L and 3M. The resultant device 300 formed using the method described in flowchart 200 is a non-planar gate all-around device, in accordance with an embodiment of the present invention.

Figure 4:
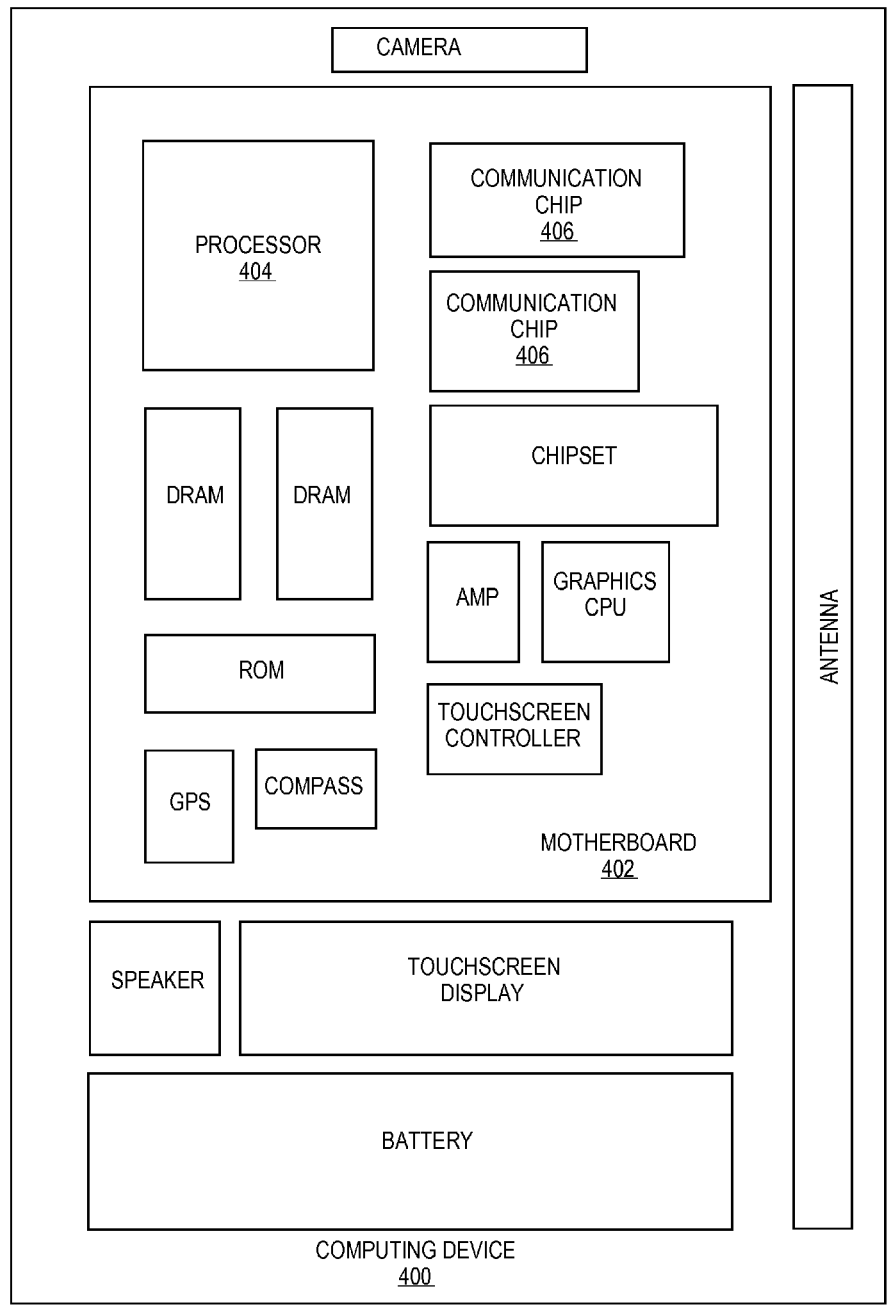
FIG. 4 illustrates a computing device 400 in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as non-planar gate all-around transistor devices, that are formed in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as such as non-planar gate all-around transistor devices, that are formed in accordance with implementations of the invention.

In further implementations, another component housed within the computing device 400 may contain an integrated circuit die that includes one or more devices, such as non-planar gate all-around transistor devices, that are formed in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Thus, one or more embodiments of the present invention may include a non-planar gate all-around transistor device with one of embedded epi source and drain regions or a bottom gate isolation layer formed between a substrate and a bottom channel nanowire, or both.

What is claimed is:

1. A semiconductor device, comprising:
   a semiconductor substrate comprising a first material, the first material having a first lattice constant;

a source region above the substrate, the source region comprising a second material, the second material having a second lattice constant different than the first lattice constant;

a drain region above the substrate, the drain region comprising the second material;

a first nanowire, the first nanowire being coupled to the source region and being coupled to the drain region, the first nanowire comprising a third material, the third material having a third lattice constant substantially the same as the second lattice constant;

a second nanowire above the first nanowire and not in direct contact with the first nanowire, the second nanowire being coupled to the source region and being coupled to the drain region, the second nanowire comprising the third material;

a gate dielectric layer around at least a portion of the first nanowire and around at least a portion of the second nanowire; and a gate electrode around at least a portion of the first nanowire and around at least a portion of the second nanowire, the gate electrode being separated from the first and second nanowires by at least the gate dielectric layer.

2. The device of claim 1, wherein the second lattice constant is larger than the first lattice constant.

3. The device of claim 1, wherein the second material is the same as the third material.

4. The device of claim 1, wherein the source region and the drain region both have side walls that are angled.

5. The device of claim 1, wherein the source region has a first width at a first position above the substrate, the source region has a second width at a second position above the substrate, the second position being a different distance from the substrate than the first position, and the first width is greater than the second width.

6. The device of claim 5, wherein the first width of the source is greater than a maximum width of the first nanowire.

7. The device of claim 1, further comprising an isolation region layer over a first portion of the substrate, wherein a second portion of the substrate extends up past a bottom surface of the isolation region layer.

8. The device of claim 7, wherein the second portion of the substrate does not extend up to a top surface of the isolation region layer.

9. The device of claim 7, wherein at least portions of the first and second nanowires are directly above the second portion of the substrate, but are not in direct contact with the second portion of the substrate.

10. The device of claim 1, wherein the drain region has a side wall, the side wall of the drain region is a <111> facet.

11. A semiconductor device, comprising:
a semiconductor substrate comprising a first semiconductor material, the semiconductor substrate having a top surface, wherein the first semiconductor material of the semiconductor substrate adjacent the top surface has a first lattice constant;

an epitaxial source region on the top surface of the semiconductor substrate, the epitaxial source region comprising a second material, the second material having a second lattice constant different than the first lattice constant;

an epitaxial drain region on the top surface of the semiconductor substrate, the epitaxial drain region comprising the second material with the second lattice constant different than the first lattice constant, the epitaxial drain region being spaced apart from the epitaxial source region;

a first channel material region above the substrate, at least a portion of the first channel material region being between the epitaxial source region and the epitaxial drain region, the first channel material region being coupled to the epitaxial source region and the epitaxial drain region, the first channel material region having a length measured along a first direction that extends from the epitaxial source region to the epitaxial drain region, the length of the first channel material region being great enough to span at least most of a distance between the epitaxial source region and the epitaxial drain region, the first channel material region having a height measured along a second direction that extends up from the substrate, the first channel material region having a width measured along a third direction substantially orthogonal to the first direction and the second direction, the first channel material region comprising a third material, the third material having a third lattice constant, the first channel material region having a first channel region;

a second channel material region above the substrate, at least a portion of the second channel material region being directly above the first channel material region and not in direct contact with the first channel material region, at least a portion of the second channel material region being between the epitaxial source region and the epitaxial drain region, the second channel material region being coupled to the epitaxial source region and the epitaxial drain region, the second channel material region having a length measured along the first direction, the length of the second channel material region being great enough to span at least most of a distance between the epitaxial source region and the epitaxial drain region, the second channel material region having a height measured along the second direction, the second channel material region having a width measured along the third direction, the second channel material region comprising the third material, the second channel material region having a second channel region;

a first gate dielectric layer around the first channel region of the first channel material region, the first gate dielectric layer surrounding the first channel region in a first cross section taken normal to a line extending from the source region to the drain region, the first gate dielectric layer not completely surrounding the first channel region in a second cross section taken through the first channel material region and parallel with a top surface of the substrate, the first gate dielectric layer comprising a first gate dielectric material;

a second gate dielectric layer around the second channel region of the second channel material region, the second gate dielectric layer surrounding the second channel region in a first cross section taken normal to a line extending from the source region to the drain region, the second gate dielectric layer not completely surrounding the second channel region in a second cross section taken through the second channel material region and parallel with a top surface of the substrate, the second gate dielectric layer comprising the first gate dielectric material; and a gate electrode material around the first channel region of the first channel material region and around the second channel region of the second channel material region, the gate electrode material being separated from the first channel region of the first channel material region by the first gate dielectric layer, the gate electrode material being separated from the second channel region of the second channel material region by the second gate dielectric layer.

12. The device of claim 11, wherein the second lattice constant is larger than the first lattice constant.

13. The device of claim 11, wherein the third lattice constant is different than the first lattice constant.

14. The device of claim 11, wherein the third lattice constant is substantially the same as the second lattice constant.

15. The device of claim 11, wherein the third material is the same as the second material.

16. The device of claim 11, wherein the epitaxial source region and the epitaxial drain region both have side walls that are angled.

17. The device of claim 11, wherein the epitaxial source region has a first width at a first position above the substrate, the epitaxial source region has a second width at a second position above the substrate, the second position being a different distance from the substrate than the first position, and the first width is greater than the second width, the first width and the second width both being measured along the third direction.

18. The device of claim 11, further comprising:
a third channel material region above the substrate, at least a portion of the third channel material region being directly above the first channel material region and directly above the second channel material region and not in direct contact with the first channel material region or the second channel material region, at least a portion of the third channel material region being between the epitaxial source region and the epitaxial drain region, the third channel material region being coupled to the epitaxial source region and the epitaxial drain region, the third channel material region having a length measured along the first direction, the length of the third channel material region being great enough to span at least most of a distance between the epitaxial source region and the epitaxial drain region, the third channel material region having a height measured along the second direction, the third channel material region having a width measured along the third direction, the third channel material region comprising the third material, the third channel material region having a third channel region.

19. The device of claim 11, wherein the first channel material region and the second channel material region are both nanowires.

* * * * *